United States Patent
Bircumshaw et al.

(10) Patent No.: US 11,998,950 B2
(45) Date of Patent: Jun. 4, 2024

(54) INCREASED MUT COUPLING EFFICIENCY AND BANDWIDTH VIA EDGE GROOVE, VIRTUAL PIVOTS, AND FREE BOUNDARIES

(71) Applicant: eXo Imaging, Inc., Redwood City, CA (US)

(72) Inventors: Brian Bircumshaw, Redwood City, CA (US); Sandeep Akkaraju, Redwood City, CA (US); Haesung Kwon, Redwood City, CA (US)

(73) Assignee: Exo Imaging, Inc., Santa Clara, CA (US)

( * ) Notice: Subject to any disclaimer, the term of this patent is extended or adjusted under 35 U.S.C. 154(b) by 408 days.

(21) Appl. No.: 17/018,304

(22) Filed: Sep. 11, 2020

(65) Prior Publication Data

US 2021/0078042 A1 Mar. 18, 2021

Related U.S. Application Data

(60) Provisional application No. 62/899,602, filed on Sep. 12, 2019.

(51) Int. Cl.
*B06B 1/06* (2006.01)
*H10N 30/50* (2023.01)
*H10N 30/87* (2023.01)
*H10N 30/00* (2023.01)

(52) U.S. Cl.
CPC .......... *B06B 1/0651* (2013.01); *B06B 1/0662* (2013.01); *B06B 1/0666* (2013.01); *H10N 30/50* (2023.02); *H10N 30/871* (2023.02); *H10N 30/10516* (2023.02); *H10N 30/877* (2023.02)

(58) Field of Classification Search
CPC .... B06B 1/0662; H10N 30/50; H10N 30/871; H10N 30/877; H10N 30/10516; H01L 41/083; H01L 41/0477; H01L 41/0471; H01L 41/0815
See application file for complete search history.

(56) References Cited

U.S. PATENT DOCUMENTS

| | | |
|---|---|---|
| 2,808,522 A | 10/1957 | Dranetz, I |
| 3,088,323 A | 5/1963 | Walter et al. |
| 4,156,800 A | 5/1979 | Sear et al. |
| 4,211,949 A | 7/1980 | Brisken et al. |
| 4,375,042 A | 2/1983 | Marcus |

(Continued)

FOREIGN PATENT DOCUMENTS

| | | |
|---|---|---|
| CN | 1445872 A | 10/2003 |
| CN | 102577436 A | 7/2012 |

(Continued)

OTHER PUBLICATIONS

PCT/US2020/050374 Invitation to Pay Additional Fees dated Nov. 13, 2020.

(Continued)

*Primary Examiner* — Bryan P Gordon
(74) *Attorney, Agent, or Firm* — Morgan, Lewis & Bockius LLP

(57) ABSTRACT

Methods for improving the electromechanical coupling coefficient and bandwidth of micromachined ultrasonic transducers, or MUTs, are presented as well as methods of manufacture of the MUTs improved by the presented methods.

61 Claims, 29 Drawing Sheets

(56) References Cited

U.S. PATENT DOCUMENTS

| | | |
|---|---|---|
| 4,445,063 A | 4/1984 | Smith |
| 4,517,842 A | 5/1985 | Twomey et al. |
| 4,630,465 A | 12/1986 | Hatton |
| 4,654,554 A | 3/1987 | Kishi |
| 4,668,906 A | 5/1987 | Ekstrand |
| 4,709,360 A | 11/1987 | Martin et al. |
| 5,488,956 A | 2/1996 | Bartelt et al. |
| 5,520,187 A | 5/1996 | Snyder |
| 5,548,564 A | 8/1996 | Smith |
| 5,825,117 A | 10/1998 | Ossmann et al. |
| 5,945,770 A | 8/1999 | Hanafy |
| 6,051,895 A | 4/2000 | Mercier |
| 6,108,121 A | 8/2000 | Mansell et al. |
| 7,382,635 B2 | 6/2008 | Noda |
| 7,532,093 B1 | 5/2009 | Pulskamp et al. |
| 8,004,158 B2 | 8/2011 | Hielscher |
| 8,626,295 B2 | 1/2014 | Doron et al. |
| 9,067,779 B1 | 6/2015 | Rothberg et al. |
| 9,479,875 B2 | 10/2016 | Hall et al. |
| 10,106,397 B1 | 10/2018 | Kim et al. |
| 10,648,852 B2 | 5/2020 | Akkaraju et al. |
| 10,656,007 B2 | 5/2020 | Akkaraju et al. |
| 2002/0109436 A1 | 8/2002 | Peng et al. |
| 2004/0039246 A1 | 2/2004 | Gellman et al. |
| 2004/0085858 A1 | 5/2004 | Khuri-Yakub et al. |
| 2005/0134574 A1 | 6/2005 | Hill |
| 2005/0146247 A1 | 7/2005 | Fisher et al. |
| 2005/0148132 A1 | 7/2005 | Wodnicki |
| 2005/0200242 A1 | 9/2005 | Degertekin |
| 2006/0113866 A1 | 6/2006 | Ganor |
| 2007/0103697 A1 | 5/2007 | Degertekin |
| 2007/0197922 A1 | 8/2007 | Bradley et al. |
| 2007/0205698 A1 | 9/2007 | Chaggares et al. |
| 2008/0009741 A1 | 1/2008 | Hyuga |
| 2008/0048211 A1 | 2/2008 | Khuri-Yakub et al. |
| 2009/0001853 A1 | 1/2009 | Adachi et al. |
| 2009/0250729 A1 | 10/2009 | Lemmerhirt et al. |
| 2010/0013574 A1 | 1/2010 | Huang |
| 2010/0168583 A1 | 7/2010 | Dausch et al. |
| 2010/0225204 A1 | 9/2010 | Hamann et al. |
| 2010/0256501 A1 | 10/2010 | Degertekin |
| 2010/0301227 A1 | 12/2010 | Muntean |
| 2010/0327695 A1 | 12/2010 | Goel et al. |
| 2011/0051461 A1 | 3/2011 | Buchwald et al. |
| 2011/0115333 A1* | 5/2011 | Ezaki ............... B06B 1/0292 |
| | | 310/300 |
| 2011/0218594 A1* | 9/2011 | Doron ................. G10K 9/122 |
| | | 310/334 |
| 2012/0091543 A1 | 4/2012 | Torashima et al. |
| 2012/0103096 A1 | 5/2012 | Kandori |
| 2012/0127136 A1 | 5/2012 | Schneider et al. |
| 2012/0187508 A1 | 7/2012 | Adler et al. |
| 2012/0206014 A1 | 8/2012 | Bibl et al. |
| 2012/0250454 A1 | 10/2012 | Rohling et al. |
| 2012/0289897 A1 | 11/2012 | Friend et al. |
| 2012/0319174 A1 | 12/2012 | Wang |
| 2013/0039147 A1 | 2/2013 | Witte et al. |
| 2013/0234559 A1 | 9/2013 | Ermolov |
| 2013/0293065 A1 | 11/2013 | Hajati et al. |
| 2013/0294201 A1 | 11/2013 | Hajati |
| 2013/0331705 A1 | 12/2013 | Fraser |
| 2014/0019072 A1 | 1/2014 | Alles |
| 2014/0035735 A1* | 2/2014 | Zellers ............... H10N 30/50 |
| | | 310/319 |
| 2014/0117812 A1 | 5/2014 | Hajati |
| 2014/0145561 A1 | 5/2014 | Jin et al. |
| 2014/0219063 A1 | 8/2014 | Hajati et al. |
| 2014/0220723 A1 | 8/2014 | Liu et al. |
| 2014/0225476 A1 | 8/2014 | Degertekin et al. |
| 2014/0249419 A1 | 9/2014 | Morita |
| 2014/0328504 A1 | 11/2014 | Stephanou et al. |
| 2015/0097468 A1 | 4/2015 | Hajati et al. |
| 2015/0145374 A1* | 5/2015 | Xu ..................... G10K 9/122 |
| | | 29/25.35 |
| 2015/0250452 A1 | 9/2015 | Jin et al. |
| 2015/0265245 A1 | 9/2015 | Von Ramm et al. |
| 2016/0007961 A1 | 1/2016 | Lee et al. |
| 2016/0027991 A1 | 1/2016 | Suzuki |
| 2016/0045935 A1 | 2/2016 | Yoon et al. |
| 2016/0105748 A1 | 4/2016 | Pal et al. |
| 2016/0107194 A1 | 4/2016 | Panchawagh et al. |
| 2016/0136686 A1 | 5/2016 | Brock-Fisher |
| 2016/0136687 A1 | 5/2016 | Lewis, Jr. et al. |
| 2016/0262725 A1 | 9/2016 | Boser et al. |
| 2017/0021391 A1 | 1/2017 | Guedes et al. |
| 2017/0209121 A1 | 7/2017 | Davis, Sr. et al. |
| 2017/0232474 A1 | 8/2017 | Oralkan et al. |
| 2017/0309808 A1 | 10/2017 | Hada et al. |
| 2017/0319180 A1 | 11/2017 | Henneken et al. |
| 2017/0322290 A1 | 11/2017 | Ng et al. |
| 2017/0368574 A1 | 12/2017 | Sammoura et al. |
| 2018/0153510 A1 | 6/2018 | Haque et al. |
| 2018/0153512 A1 | 6/2018 | Akkaraju et al. |
| 2019/0176193 A1 | 6/2019 | Shulepov et al. |
| 2019/0316957 A1 | 10/2019 | Akkaraju et al. |
| 2019/0316958 A1 | 10/2019 | Akkaraju et al. |
| 2019/0387321 A1 | 12/2019 | Dayton et al. |
| 2020/0101492 A1 | 4/2020 | Akiyama et al. |
| 2020/0205776 A1 | 7/2020 | Dekker et al. |
| 2020/0225082 A1 | 7/2020 | Akkaraju et al. |
| 2020/0249079 A1 | 8/2020 | Akkaraju et al. |
| 2020/0266798 A1 | 8/2020 | Shelton et al. |
| 2021/0069748 A1 | 3/2021 | Bircumshaw et al. |
| 2021/0151661 A1 | 5/2021 | Kwon et al. |
| 2021/0172788 A1 | 6/2021 | Akkaraju et al. |
| 2021/0236090 A1 | 8/2021 | Akkaraju et al. |
| 2021/0364348 A1 | 11/2021 | Akkaraju et al. |
| 2022/0193722 A1 | 6/2022 | Bircumshaw et al. |
| 2022/0205836 A1 | 6/2022 | Akkaraju et al. |

FOREIGN PATENT DOCUMENTS

| | | |
|---|---|---|
| CN | 104271266 A | 1/2015 |
| CN | 105310718 A | 2/2016 |
| CN | 106500824 A | 3/2017 |
| CN | 106999163 A | 8/2017 |
| CN | 107113503 A | 8/2017 |
| CN | 109332141 A | 2/2019 |
| EP | 3453056 A1 | 3/2019 |
| JP | S61223683 A | 10/1986 |
| JP | S6276392 A | 4/1987 |
| JP | H02218983 A | 8/1990 |
| JP | H06350155 A | 12/1994 |
| JP | 2007088805 A | 4/2007 |
| JP | 2007510324 A | 4/2007 |
| JP | 2009165212 A | 7/2009 |
| JP | 2012129662 A | 7/2012 |
| JP | 2013123150 A | 6/2013 |
| JP | 2014000122 A | 1/2014 |
| JP | 2014127921 A | 7/2014 |
| JP | 2016503312 A | 2/2016 |
| JP | 2018046512 A | 3/2018 |
| WO | WO-2006123300 A2 | 11/2006 |
| WO | WO-2007099696 A1 | 9/2007 |
| WO | WO-2011026187 A1 | 3/2011 |
| WO | WO-2011033887 A1 | 3/2011 |
| WO | WO-2012117996 A1 | 9/2012 |
| WO | WO-2013043906 A1 | 3/2013 |
| WO | WO-2013158348 A1 | 10/2013 |
| WO | WO-2015131083 A1 | 9/2015 |
| WO | WO-2017025438 A1 | 2/2017 |
| WO | WO-2017132517 A1 | 8/2017 |
| WO | WO-2017182344 A1 | 10/2017 |
| WO | WO-2017216139 A1 | 12/2017 |
| WO | WO-2018102223 A1 | 6/2018 |
| WO | WO-2019164721 A1 | 8/2019 |
| WO | WO-2019199397 A1 | 10/2019 |
| WO | WO-2019199398 A1 | 10/2019 |
| WO | WO-2019226547 A1 | 11/2019 |

(56) References Cited

FOREIGN PATENT DOCUMENTS

| | | |
|---|---|---|
| WO | WO-2020028580 A1 | 2/2020 |
| WO | WO-2021050853 A1 | 3/2021 |

OTHER PUBLICATIONS

U.S. Appl. No. 17/180,308 Office Action dated Dec. 10, 2021.
Co-pending U.S. Appl. No. 17/215,776, inventors Bircumshaw; Brian et al., filed Mar. 29, 2021.
Co-pending U.S. Appl. No. 17/218,656, inventors Kwon; Haesung et al., filed Mar. 31, 2021.
Co-pending U.S. Appl. No. 17/364,381, inventors Mantravadi; Naresh et al., filed Jun. 30, 2021.
Co-pending U.S. Appl. No. 17/364,397, inventors Kwon; Haesung et al., filed Jun. 30, 2021.
Hill et al. The Role Radius of Curvature Plays in Thiolated Oligonucleotide Loading on Gold Nanopartictes. ACS Nano 3(2):418-424 (2009) Retrieved on Sep. 2, 2021 from https://www.ncbi.nlm.nih.gov/pmc/articles/PMC3241534.
PCT/US2021/024667 International Search Report and Written Opinion dated Jul. 8, 2021.
PCT/US2021/025109 International Search Report and Written Opinion dated Jul. 7, 2021.
PCT/US2021/039977 International Search Report and Written Opinion dated Oct. 6, 2021.
PCT/US2021/039994 International Search Report and Written Opinion dated Nov. 5, 2021.
Zhang et al. Double-SOI wafer-bonded CMUTs with improved electrical safety and minimal roughness of dielectric and electrode surfaces. Journal of microelectromechanical systems 21(3):668-680 (2012).
APC International, Ceramic manufacturing series—poling PZT ceramics. https://www.americanpiezo.com/blog/ceramic-manufacturing-series-poling-pzt-ceramics/ [1-3] (2016).
Assef et al., A reconfigurable arbitrary waveform generator using PWM modulation for ultrasound research. BioMedical Engineering OnLine 12:24 [1-13] (2013).
Choudhry et al., Comparison of tissue harmonic imaging with conventional US in abdominal disease. RadioGraphics: Imaging and Therapeutic Technology 20:1127-1135 (2000).
Dahl, Ultrasound beamforming and image formation. http://people.duke.edu/-jjd/RSNA_USbeamforming.pdf [Slide presentation] (c. 2005).
Dausch et al., Theory and operation of 2-D array piezoelectric micromachined ultrasound transducers. IEEE Transactions on Ultrasonics, Ferroelectrics, and Frequency Control 55(11):2484-2492 (2008).
Doerry, Generating nonlinear FM chirp waveforms for radar. Sandia Report, SAND2006-5856:1-34 (2006).
Felix et al., Biplane ultrasound arrays with integrated multiplexing solution for enhanced diagnostic accuracy in endorectal and transvaginal imaging. http://www.vermon.com/vermon/publications/Felix_UFFC_2005.pdf (2005).
Goldman, Apple's Lightning connector and you: what you should know. CNET Sep. 19, 2012: https://www.cnet.com/news/apples-lightning-connector-and-you-what-you-should-know/ (2012).
Guedes et al., Aluminum nitride pMUT based on a flexurally-suspended membrane. IEEE 16th International Solid-State Sensors, Actuators and Microsystems Conference: 12169346 (2011).
Hajati et al., Three-dimensional micro electromechanical system piezoelectric ultrasound transducer. Appl. Phys. Lett. 101:253101 (2012); doi: 10.1063/1.4772469 (2012).
Harput, Use of chirps in medical ultrasound imaging. Ultrasound Group, School of Electronic and Electrical Engineering, University Of Leeds, PHD Thesis, Dec. 2012.
Karki, Signal conditioning piezoelectric sensors. Texas Instruments Application report, SLA033A:1-5 (2000).

Khuri-Yakub et al., Capacitive micro machined ultrasonic transducers for medical imaging and therapy. Journal of Micromech Microeng. 21(5):054004-054014 (2011).
Lach et al., Piezoelectric materials for ultrasonic probes. http://www.ndt.net/article/platte2/platte2.htm NDTnet 1(9):1-9 (1996).
Lee et al., Wafer-to-wafer alignment for three-dimensional integration: a review. Journal of MicroElectroMechanical Systems 20(4):885-898 (2011).
Lu et al., High frequency piezoelectric micromachined ultrasonic transducer array for intravascular ultrasound imaging. Proceedings of the IEEE International Conference on Micro Electro Mechanical Systems (MEMS):06765748 (2014).
Martin, Introduction to B-mode imaging. Cambridge University Press; Diagnostic Ultrasound: Physics and equipment, 2nd Edition. Chapter 1:1-10 (2010).
Mina, High frequency transducers from PZT films. Materials Science and Engineering Thesis; Pennsylvania State University:1-199 (2007).
Moazzami et al., Electrical characteristics of ferroelectric PZT thin films for DRAM applications. IEEE Transaction on Electron Devices 39(9):2044-2049 (1992).
Orenstein Scanning in pain—sonographers seek relief from job-related hazard. Radiology Today 10(8):24 (2009).
Ovland, Coherent plane-wave compounding in medical ultrasound imaging. NTNU-Trondheim, Norwegian University of Science and Technology, Master of Science Thesis, 1-62 (Jun. 2012).
PCT/US2017/063163 International Search Report and Written Opinion dated Feb. 15, 2018.
PCT/US2019/021501 International Search Report and Written Opinion dated Jul. 12, 2019.
PCT/US2019/021515 International Search Report and Written Opinion dated May 31, 2019.
PCT/US2019/033119 International Search Report and Written Opinion dated Aug. 9, 2019.
PCT/US2019/044528 International Search Report and Written Opinion dated Oct. 16, 2019.
Pye et al., Adaptive time gain compensation for ultrasonic imaging. Ultrasound in Medicine and Biology 18(2):205-212 [abstract] (1992).
Rodriguez et al., Low cost matching network for ultrasonic transducers. Physics Procedia 3:1025-1031 (2010).
Smyth, Design and modeling of a PZT thin film based piezoelectric micromachined ultrasonic transducer (PMUT). MSME Thesis, MIT:1-156 (2012).
Spectral doppler. http://www.echocardiographer.org/Echo%20Physics/spectral%20doppler.html (2017).
Szabo. Diagnostic ultrasound imaging: inside out. Elsevier Academic Press, ISBN: 0-12-680145-2 (572 pgs) (2014).
Trots et al., Synthetic aperture method in ultrasound imaging. InTech Press; Ultrasound Imaging, Masayuki Tanabe (Ed.). http://www.intechopen.com/books/ultrasound-imaging/synthetic-aperture-method-in-ultrasound-imaging. Chapter 3:37-56 (2011).
U.S. Appl. No. 15/820,319 Office Action dated May 14, 2020.
U.S. Appl. No. 15/951,118 Office Action dated Sep. 20, 2019.
U.S. Appl. No. 15/951,121 Office Action dated May 6, 2019.
U.S. Appl. No. 15/951,121 Office Action dated Nov. 19, 2019.
U.S. Appl. No. 16/833,333 Office Action dated Sep. 8, 2020.
Wang et al., Broadband piezoelectric micromachined ultrasonic transducer (pMUT) using mode-merged design. Proceedings of the 10th IEEE International Conference on Nano/Micro Engineered and Molecular Systems (IEEE-NEMS 2015): 15260900. Xi'an, China, Apr. 7-11, 2015.
Wang et al., Zero-bending piezoelectric micromachined ultrasonic transducer (pMUT) with enhanced transmitting performance. Journal of Microelectromechanical Systems 24(6):2083-2091 (2015).
PCT/US2020/050374 International Search Report and Written Opinion dated Feb. 2, 2021.
U.S. Appl. No. 16/837,800 Office Action dated May 7, 2021.
U.S. Appl. No. 17/272,910 Notice of Allowance dated Jun. 1, 2023, 10 pages.

\* cited by examiner

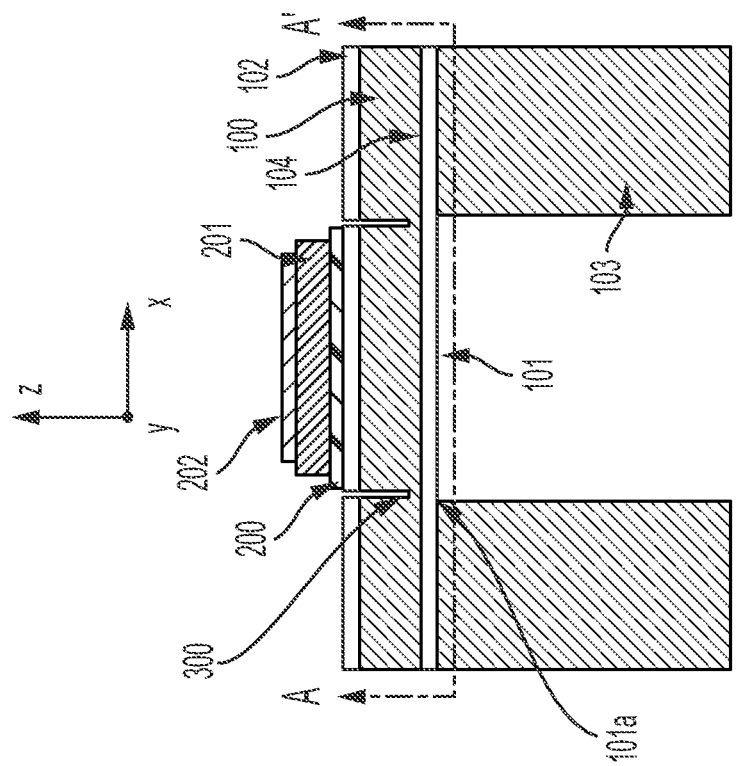
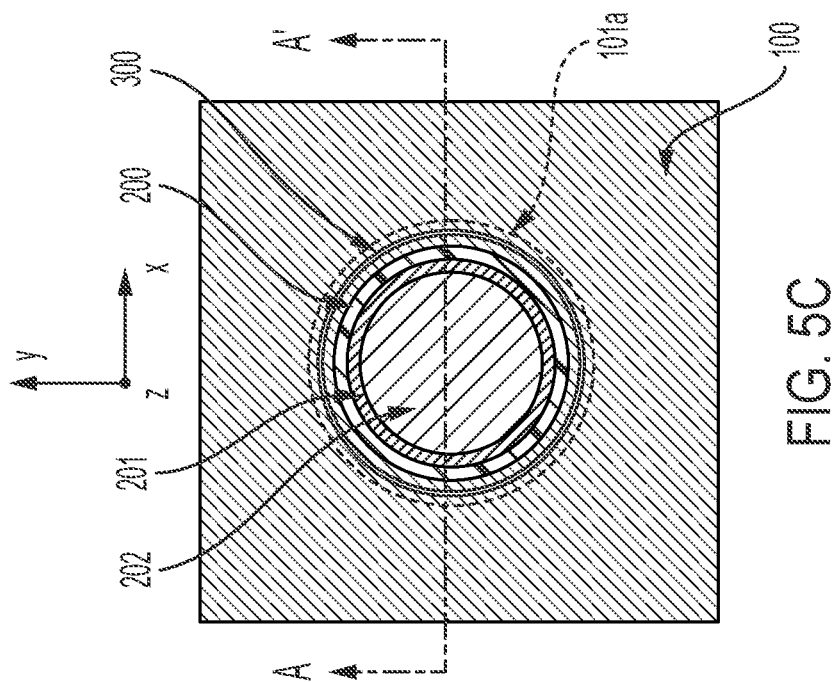
FIG. 5D
FIG. 5C

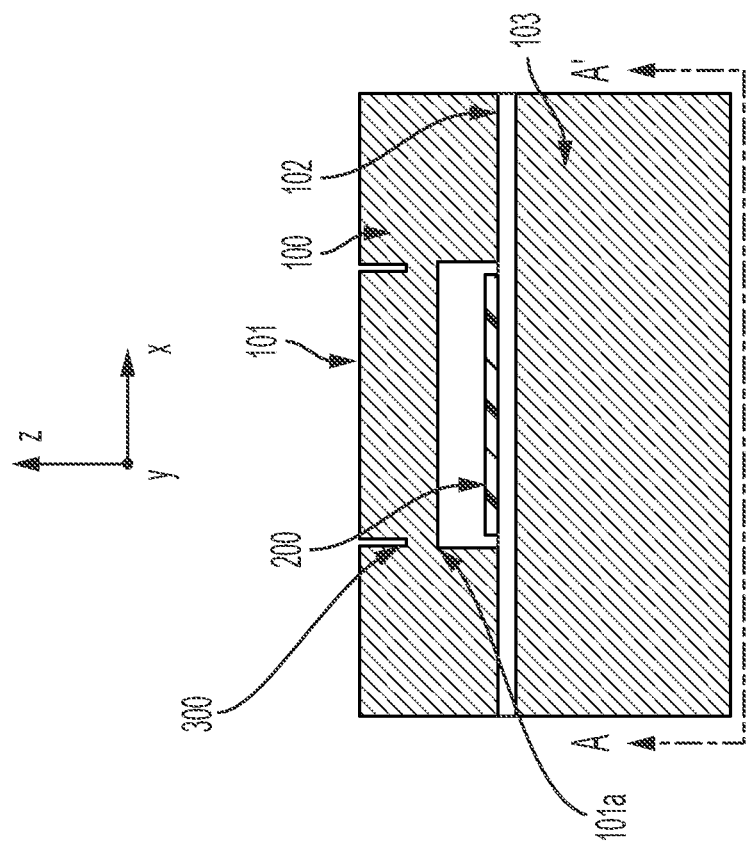
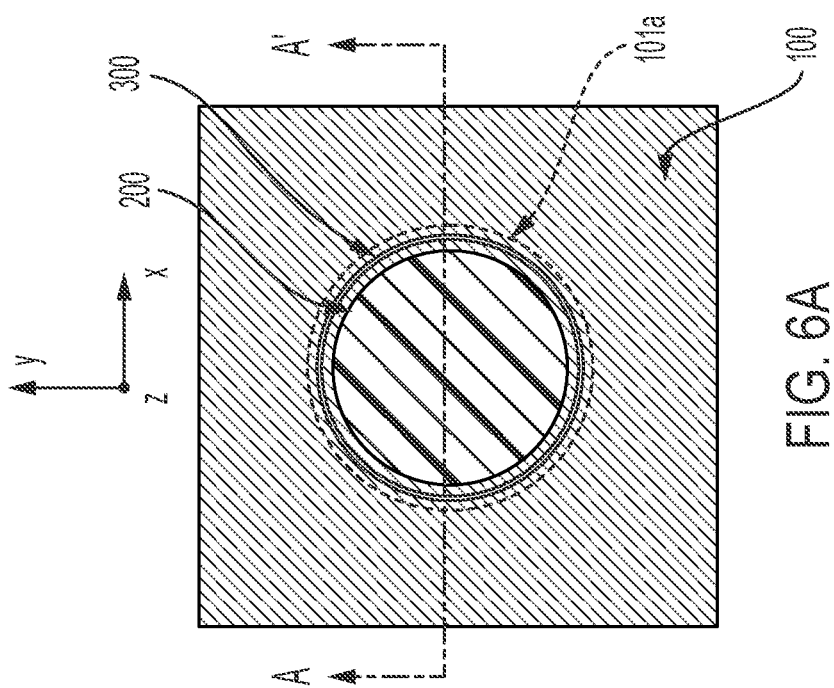
FIG. 6A
FIG. 6B

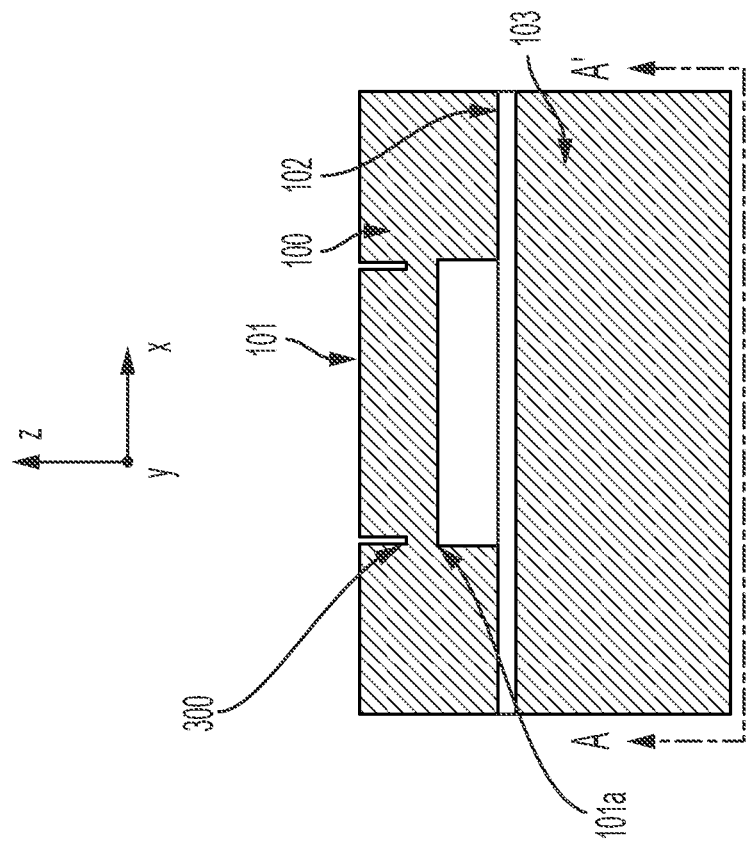
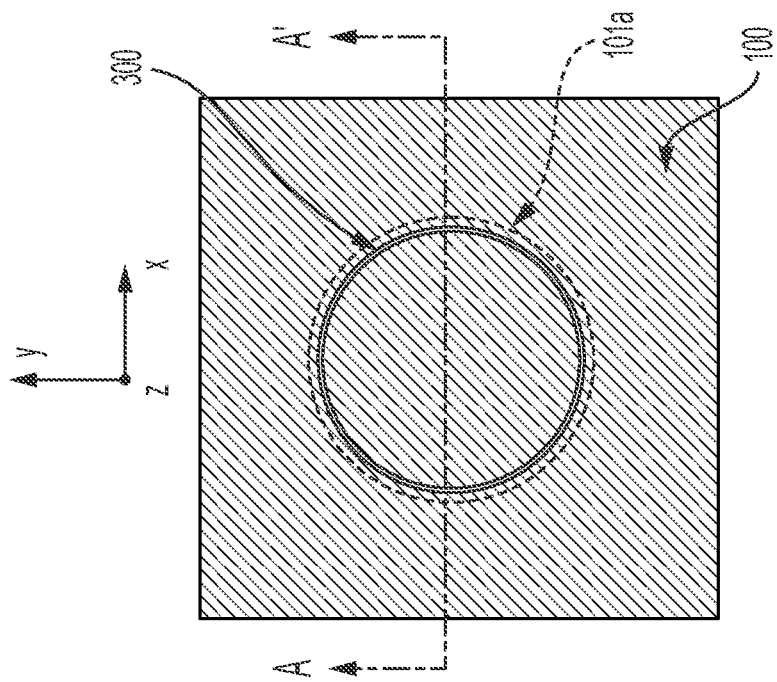
FIG. 6D
FIG. 6C

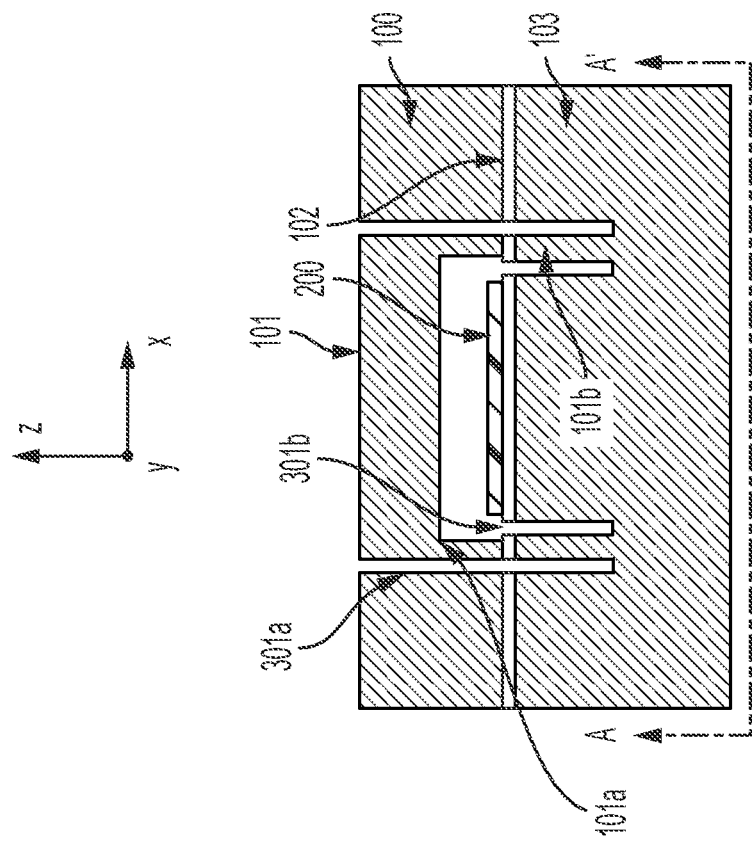
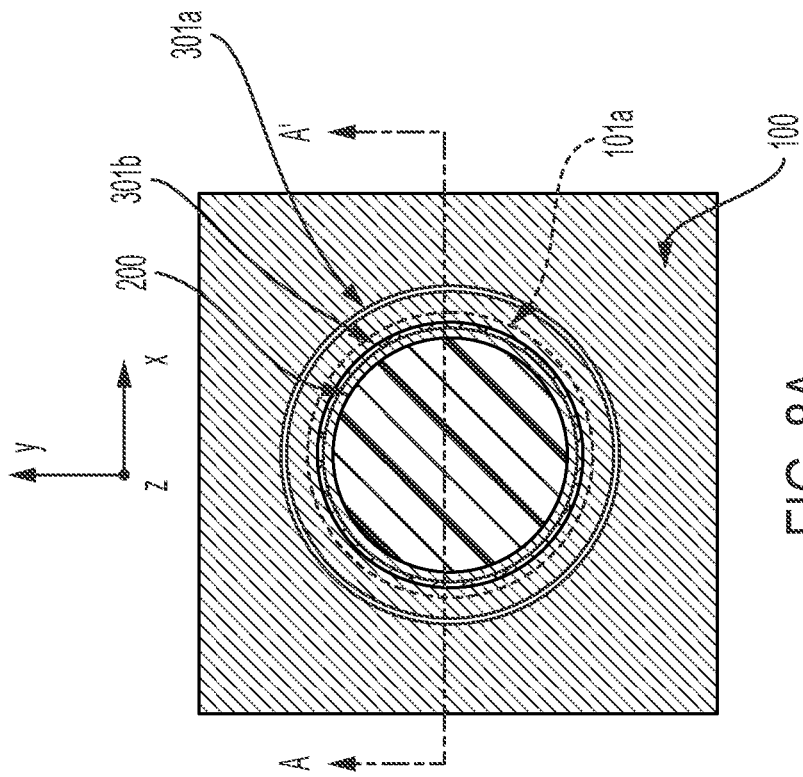
FIG. 8A
FIG. 8B

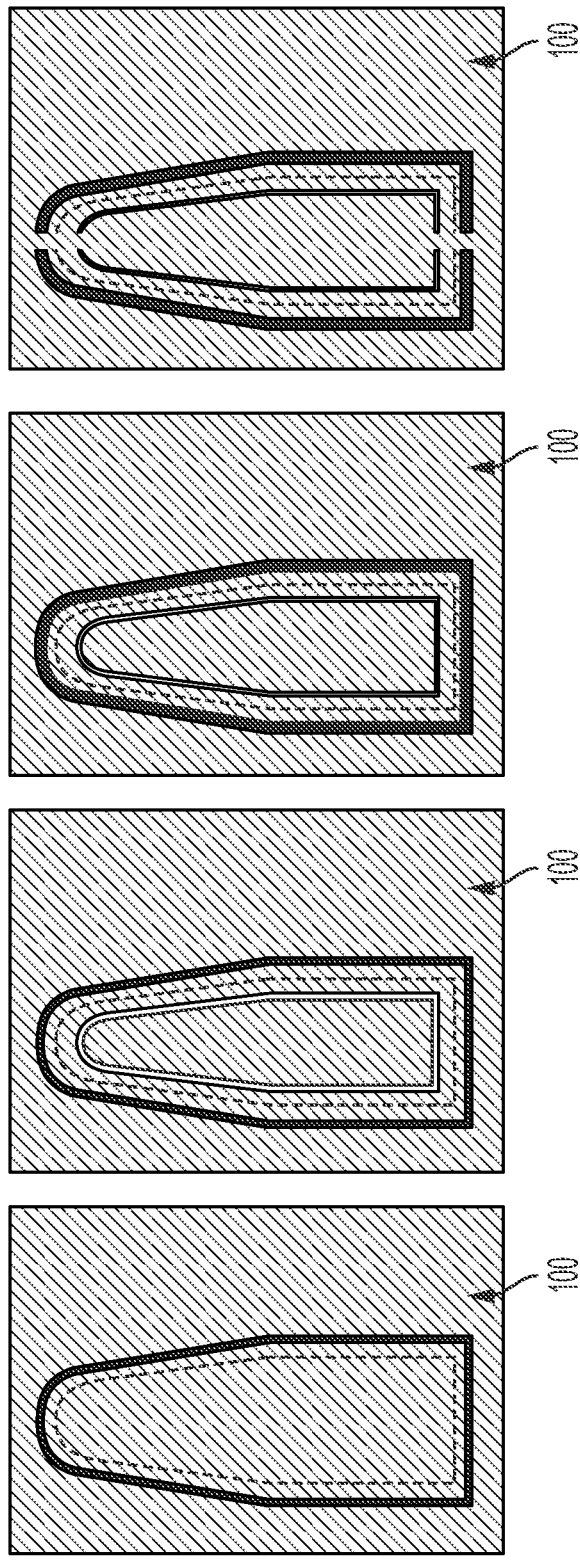

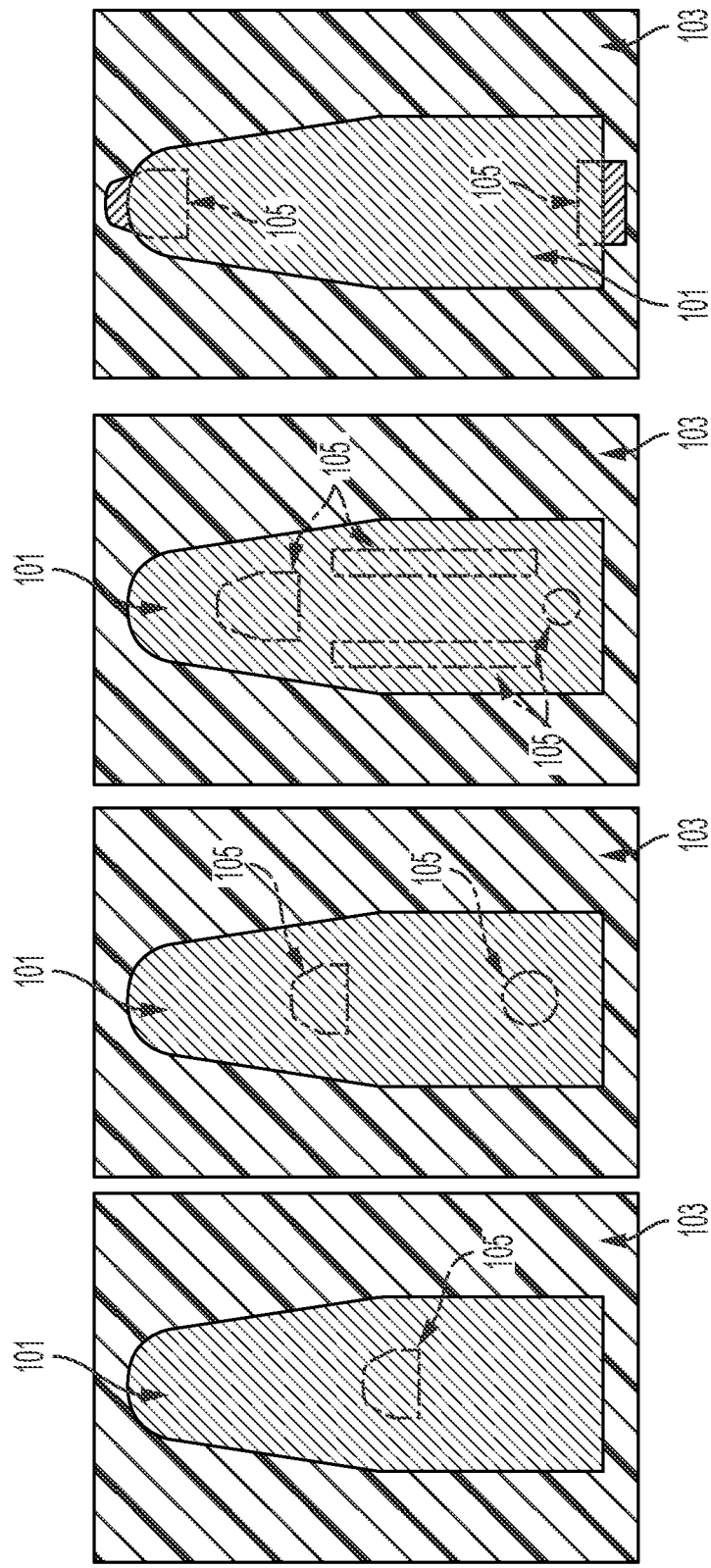

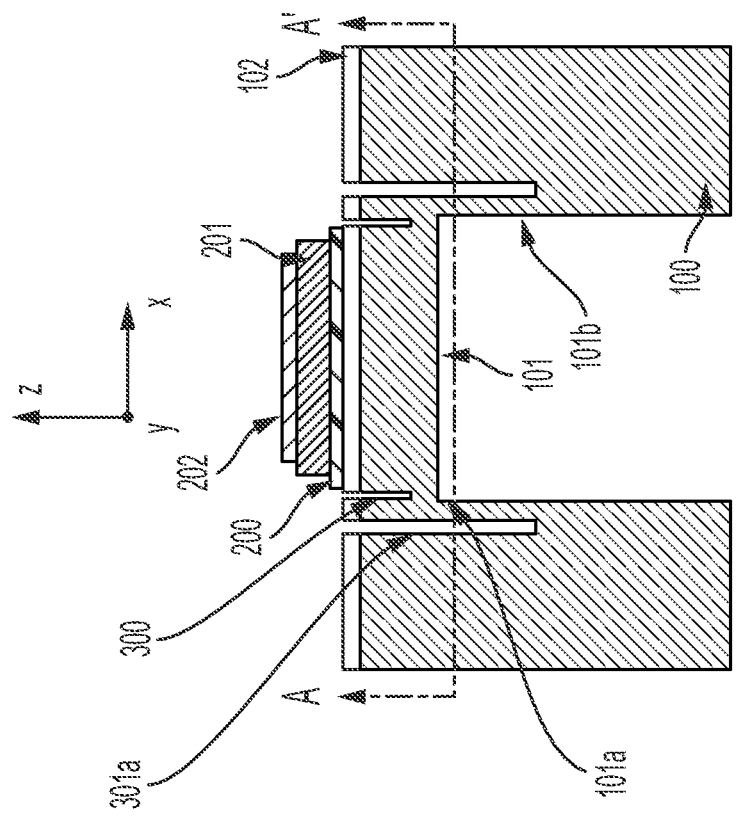
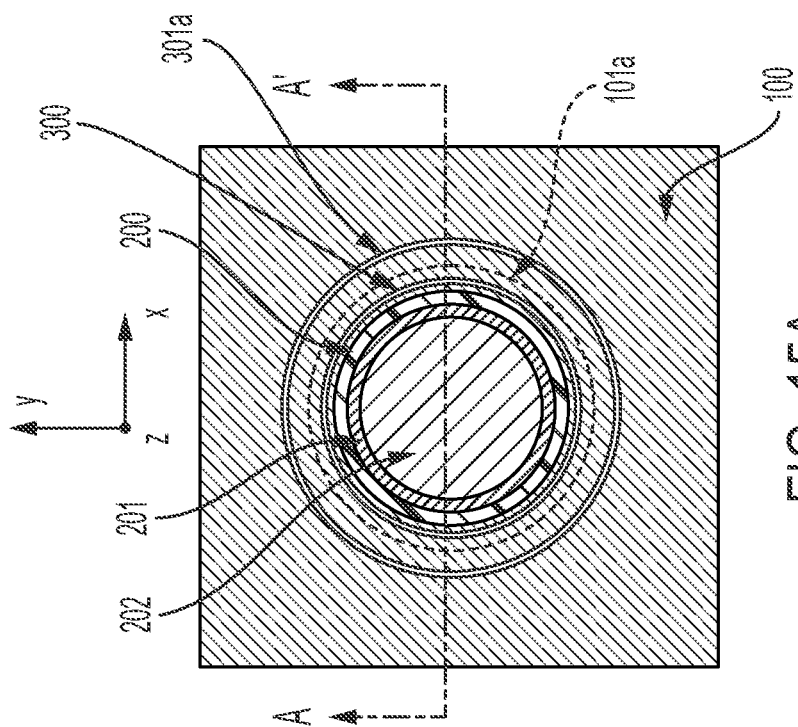
FIG. 15A
FIG. 15B

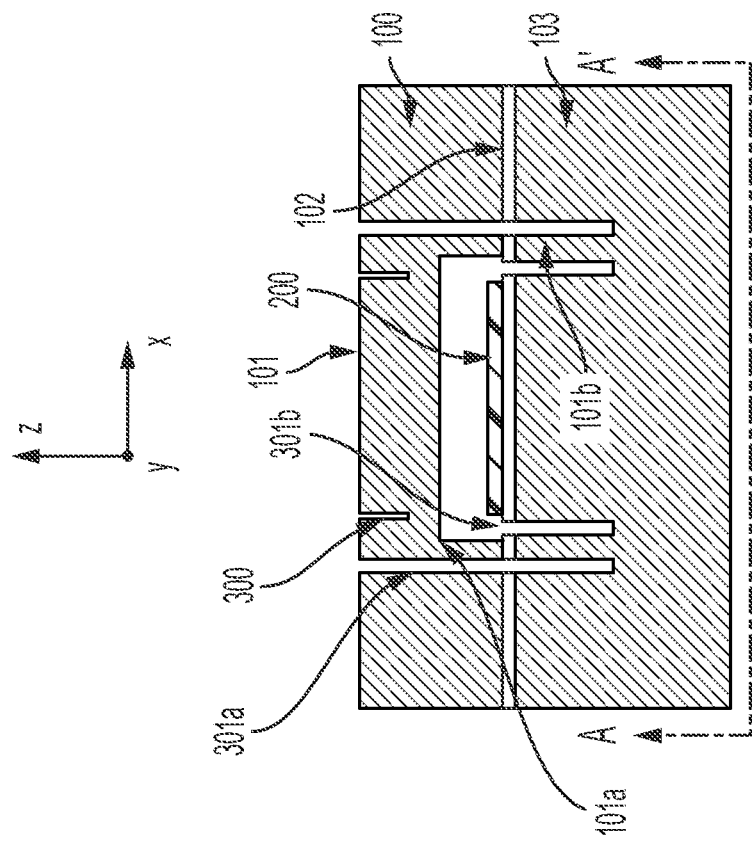
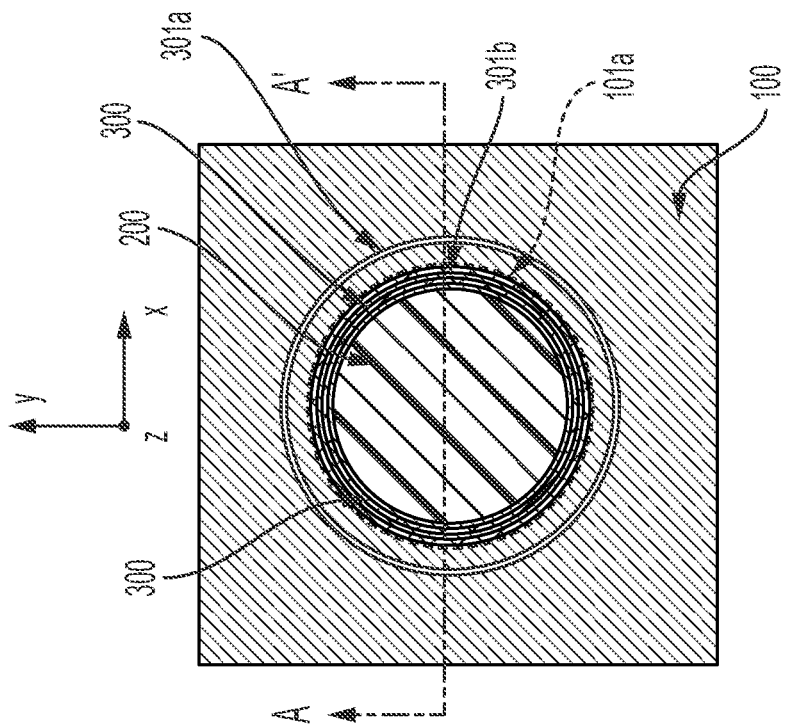
FIG. 16A
FIG. 16B

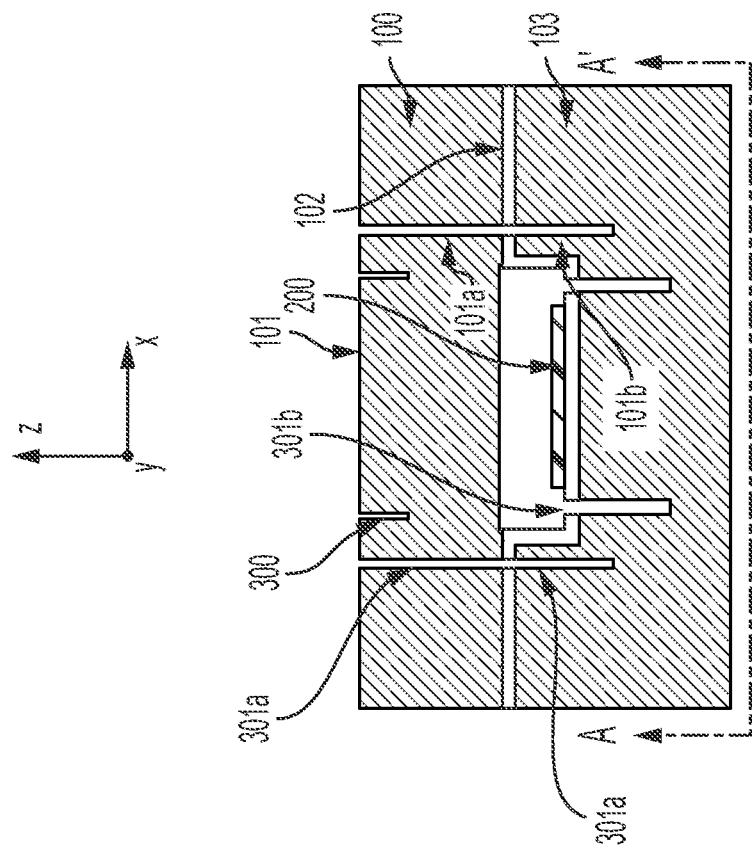
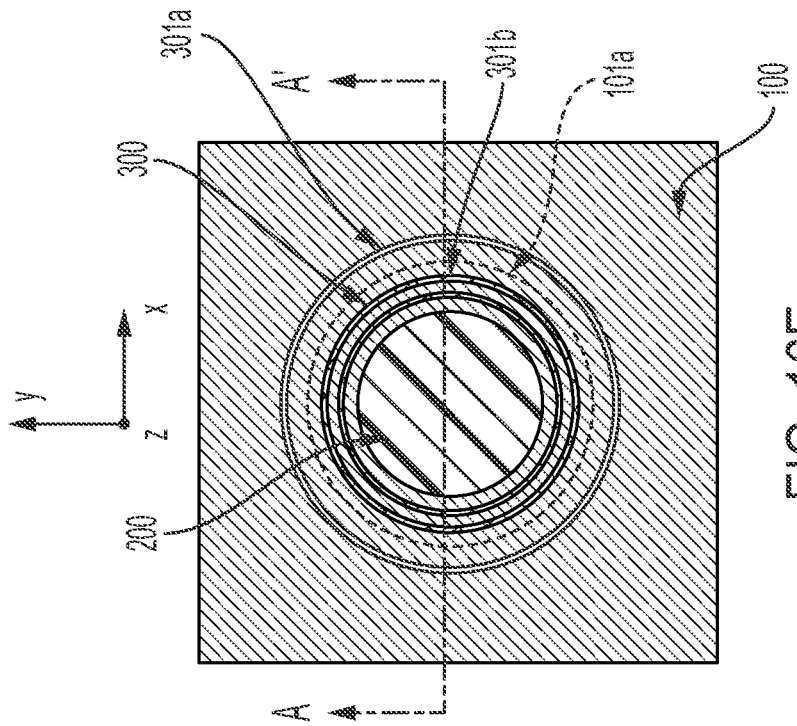
FIG. 16E
FIG. 16F

INCREASED MUT COUPLING EFFICIENCY AND BANDWIDTH VIA EDGE GROOVE, VIRTUAL PIVOTS, AND FREE BOUNDARIES

BACKGROUND

Micromachined ultrasonic transducers (MUTs) are devices that convert energy between the electrical domain and acoustic domain. They typically come in two varieties: capacitive MUTs (cMUTs) and piezoelectric MUTs (pMUTs). cMUTs utilize the capacitance between two plates for electromechanical transduction, while pMUTs utilize the piezoelectric property of a piezoelectric film to accomplish the electromechanical transduction.

SUMMARY

Examples of a conventional circular diaphragm pMUT and cMUT are illustrated in FIGS. 1a-1b and FIGS. 2a-2d, respectively. A diaphragm 101 is formed from substrate 100. In the case of the pMUT, a piezoelectric stack composed of a bottom electrode 200, a piezoelectric layer 201, and a top electrode 202, is placed on or near the diaphragm 101 on top of a dielectric layer 102. In the case of the cMUT, the substrate is attached to a dielectric layer 102 on top of a handle substrate 103. The diaphragm 101 is assumed to be conductive, and a second bottom electrode 200 is placed under the diaphragm to form a capacitor between 101 and 200.

While many metrics describe MUTs, two of the most important are the MUT's effective electromechanical coupling, $k_{eff}^2$, and its electrical and mechanical quality factors, $Q_e$ and $Q_m$, respectively. The $k_{eff}^2$ of a device determines how efficiently it converts electrical into acoustic energy. As a result, $k_{eff}^2$ is a key driver of the power specifications of a product using that MUT. $k_{eff}^2$ typically varies between 0 and 1, with 1 being better. The mechanical and electrical quality factors drive the bandwidth of the transducer, which are the frequencies over which the transducer is most effective. For most applications, particularly imaging, larger bandwidth is better, which means lower quality factors are better.

Advantageously, the electromechanical coupling and quality factors are related:

$$Q_n, Q_u = \frac{1 - k_{eff}^2}{k_{eff}^2} \quad [1]$$

This means that maximizing $k_{eff}^2$ will both maximize the transduction efficiency as well as minimize the system's quality factor.

While there are multiple ways to influence $k_{eff}^2$, the present disclosure will focus on the clamping conditions of the MUT diaphragm. From [2], for a circular pMUT oscillating in its $n^{th}$ axisymmetric mode, we have:

$$k_{eff,n}^2 = \frac{1 - k_{31}^2}{k_{31}^2 + C_n(1 - k_{31}^2)\lambda_{0n}^4 J_0(\lambda_{0n})} \quad [2]$$

where $k_{31}^2$ is the coupling coefficient of the material (a material constant), $\lambda_{0n}$ is the natural frequency parameter of the $n^{th}$ mode (highly dependent on edge clamping conditions), $J_0$ is the Bessel function of the first kind of order 0, and $C_n$ is a constant dependent on the particular pMUT design (electrode coupling constant, flexural rigidity, and electrode area to diaphragm area ratio; see [2] for full equations). For a given $k_{31}^2$ coupling coefficient and design constant $C_n$, $k_{eff,n}^2$ can be maximized by driving $\lambda_{0n}$ towards 0.

The natural frequency parameter is highly dependent on the boundary conditions under consideration, as illustrated in the comparison bar chart FIG. 3. Conventional MUT designs utilize clamped edges. The "free edge" in FIG. 3 is equivalent to ideal piston motion and represents optimal coupling. Between these two extremes, multiple edge conditions are of interest to improve electromechanical coupling and bandwidth.

While multiple factors influence $k_{eff}^2$, intuitively the increased coupling factor can be related back to the normalized volume displacement. For example, the comparison graph of FIG. 4 illustrates the normalized displacement curves of three standard circular diaphragm MUTs: clamped edge (similar to FIGS. 1a-1b and FIGS. 2a-2d), simply supported edge (i.e., an edge that allows rotation but not displacement), and free edge clamped center. Integrating the displacement by surface area, one can calculate the displaced volume of each MUT relative to an ideal piston:

Clamped Edge=31% of piston displaced volume.

Simply Support Edge MUT=45% of piston displaced volume.

Free Edge, Clamped Center MUT=54% of piston displaced volume.

A higher displaced volume indicates better coupling.

In one aspect, disclosed herein are micromachined ultrasonic transducers (MUTs) comprising: a diaphragm with substantially free edges; one or more electrodes; and one or more anchors clamping the diaphragm at locations within the diaphragm periphery, along the diaphragm periphery, or both within and along the diaphragm periphery, to a substrate. The diaphragm, the one or more electrodes, and the one or more anchors, can have any shape. In some embodiments, the edges are free and the anchors reside completely within the diaphragm. In some embodiments, the MUT is a pMUT comprising a piezoelectric film. In further embodiments, the one or more electrodes are electrically coupled to the piezoelectric film. In further embodiments, the piezoelectric film is situated opposite the one or more anchors. In other embodiments, the piezoelectric film is situated on the same side as the one or more anchors. In some embodiments, the piezoelectric film is between the one or more anchors and the diaphragm. In some embodiments, the diaphragm comprises a groove. In some embodiments, the MUT comprises a plurality of anchors, wherein a subset of the plurality of anchors are attached to one or more vertical cantilever shells. In some embodiments, the MUT comprises a plurality of anchors, wherein a subset of the plurality of anchors are attached to one or more vertical cantilever shells, and wherein the diaphragm comprises a groove. In some embodiments, the MUT is a cMUT. In further embodiments, the one or more electrodes are electrically coupled to the diaphragm between a gap. In further embodiments, the diaphragm comprises a groove. In still further embodiments, the MUT comprises a plurality of anchors, wherein a subset of the plurality of anchors are attached to one or more vertical cantilever shells. In still further embodiments, the MUT comprises a plurality of anchors, wherein a subset of the plurality of anchors are attached to one or more vertical cantilever shells, and wherein the diaphragm comprises a groove.

In another aspect, disclosed herein are micromachined ultrasonic transducers (MUTs) comprising a clamped diaphragm comprising a vertical cantilever shell, the vertical cantilever shell attached to an edge of the diaphragm. The diaphragm can have any shape. In some embodiments, the vertical cantilever shell forms a virtual pivot substantially preventing out of plane motion, but allowing for rotation of the diaphragm edge while imparting a counter-torque. In various embodiments, the vertical cantilever shell has a thickness between 0.1 μm and 50 μm, and wherein the vertical cantilever shell has a height between 1 and 100 times greater than its thickness. In still further embodiments, the vertical cantilever shell is not continuous about the diaphragm edge, but has areas with no virtual pivot. In still further embodiments, the MUT is multimodal.

In another aspect, disclosed herein are micromachined ultrasonic transducers (MUTs) comprising a clamped diaphragm comprising a groove. The clamped diaphragm can have any shape. In some embodiments, the MUT is a pMUT. In various embodiments, the groove is within 20 diaphragm thicknesses of a diaphragm boundary, and wherein the groove has a width no larger than 10 diaphragm thicknesses, and wherein the groove has a depth of between 1% to 100% of the diaphragm thickness. In some embodiments, the groove has a constant width. In other embodiments, the groove has a variable width. In some embodiments, the groove is disrupted at one or more locations to allow for electrical routing. In some embodiments, the MUT is multimodal. In some embodiments, the MUT is a cMUT. In various embodiments, the groove is within 20 diaphragm thicknesses of a diaphragm boundary, and wherein the groove has a width no larger than 10 diaphragm thicknesses, and wherein the groove has a depth of between 1% to 100% of the diaphragm thickness. In some embodiments, the groove has a constant width. In other embodiments, the groove has a variable width. In some embodiments, the groove is disrupted at one or more locations to allow for electrical routing. In some embodiments, the MUT is multimodal.

In yet another aspect, disclosed herein are MUT arrays configured for ultrasound imaging, wherein the array comprises a plurality of the MUTs described herein. In some embodiments, each MUT of the plurality of the MUTs is a pMUT. In other embodiments, each MUT of the plurality of the MUTs is a cMUT. In some embodiments, each MUT of the plurality of the MUTs comprises a vertical cantilever shell formed from multiple etches.

In yet another aspect, disclosed herein are methods of manufacturing the MUTs and MUT arrays described herein.

In one aspect, disclosed herein are micromachined ultrasound transducers (MUTs) comprising: a piezoelectric stack comprising a substrate, an insulating layer, a top electrode, a piezoelectric layer, and a bottom electrode, wherein the piezoelectric stack has edge portions and a central portion, wherein the piezoelectric stack has one or more grooves extending through at least the top electrode, piezoelectric layer, bottom electrode, and insulating layer and into at least a portion of the substrate, and wherein the one or more grooves are disposed between the edge portions and the central portion of the piezoelectric stack; a base; one or more anchors coupling the central portion of the piezoelectric stack to the base, leaving the edge portions of the piezoelectric stack free and the central portion of the piezoelectric stack is clamped to the base, the one or more anchors providing an electrical coupling between the base to the piezoelectric stack; and a plurality of conductors, the plurality of conductors comprising (i) a first conductor electrically coupling the top electrode of the piezoelectric stack to the base through a first via through the thickness of the piezoelectric stack and (ii) a second conductor electrically coupling the bottom electrode of the piezoelectric stack to the base through a second via through the thickness of the piezoelectric stack, wherein the first and second vias are disposed between the edge portions and the central portion of the piezoelectric stack.

BRIEF DESCRIPTION OF THE DRAWINGS

A better understanding of the features and advantages of the present subject matter will be obtained by reference to the following detailed description that sets forth illustrative embodiments and the accompanying drawings of which:

FIG. 4 shows a graph of normalized displacement curves for different edge conditions for a circular diaphragm of radius a.

FIGS. 5C and 5D show an exemplary circular diaphragm pMUT with a topside groove and using a silicon on insulator (SOI) wafer, including a buried oxide layer between the device and handle layers, which makes the cavity etch in the handle substrate more manufacturable: (c) in layout form, and (d) in cross-section, respectively.

FIGS. 6A and 6B show an exemplary circular diaphragm cMUT with a topside groove: (a) in layout form, and (b) in cross-section, respectively.

FIGS. 6C and 6D show an exemplary circular diaphragm cMUT with a topside groove and with a conductive portion at the top of the handle substrate in lieu of a bottom electrode as in the cMUT of FIGS. 6A and 6B: (c) in layout form, and (d) in cross-section, respectively.

FIGS. 8A and 8B show an exemplary circular diaphragm cMUT with a topside virtual pivot etch: (a) in layout form, and (b) in cross-section, respectively.

FIGS. 10A-10D show exemplary variations on virtual pivots: (a) arbitrary diaphragm shape, (b) multiple virtual pivot trenches, (c) virtual pivot trenches of variable width, and (d) select areas without virtual pivot trenches, respectively. For simplicity, only the diaphragm edges (dashed lines) and first and second virtual pivot etches (solid lines, thick and thin, respectively) are shown.

FIGS. 14A-14D show exemplary variations on free edges with fixed interior areas and/or fixed edge areas: (a) arbitrary diaphragm shape, (b) multiple anchor areas, (c) multiple anchor areas with arbitrary shapes, and (d) select areas with fixed edges where anchor overlaps edges, respectively. For simplicity, only the diaphragms 101 are and anchors (dashed lines are dark grey interior) are shown.

FIGS. 15A and 15B show an exemplary circular diaphragm pMUT with both edge groove and virtual pivot etches: (a) in layout form, and (b) in cross-section, respectively.

FIGS. 16A and 16B show an exemplary circular diaphragm cMUT with both edge groove and virtual pivot etches: (a) in layout form, and (b) in cross-section, respectively.

FIGS. 16E and 16F show an exemplary circular diaphragm cMUT with both edge groove and virtual pivot etches, and with the gap defining the diaphragm is formed in the handle: (e) in layout form, and (f) in cross-section, respectively.

DETAILED DESCRIPTION

Figure 1B:
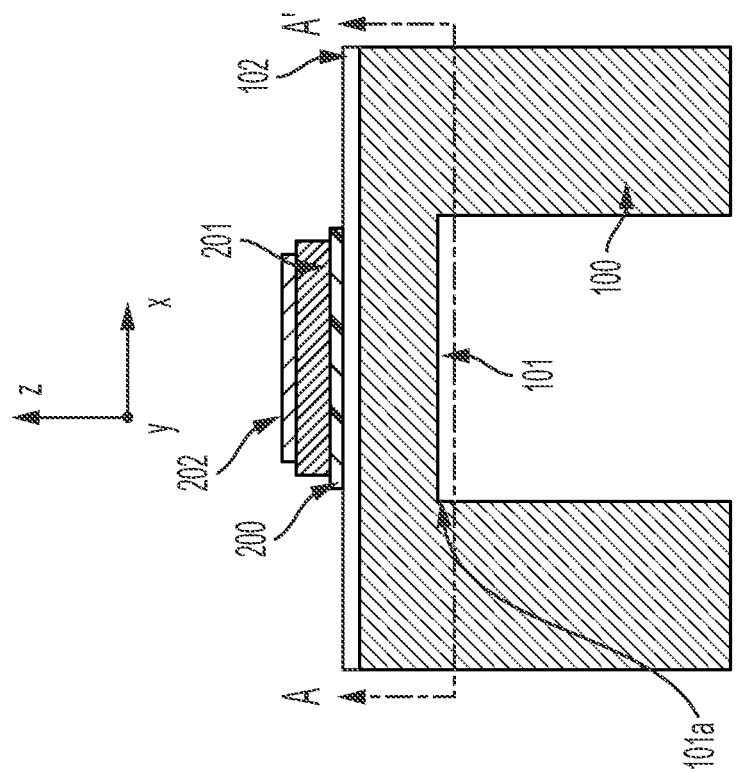
FIGS. 1A and 1B show a conventional circular diaphragm pMUT: (a) in layout form, and (b) in cross-section, respectively.
Figure 1A:
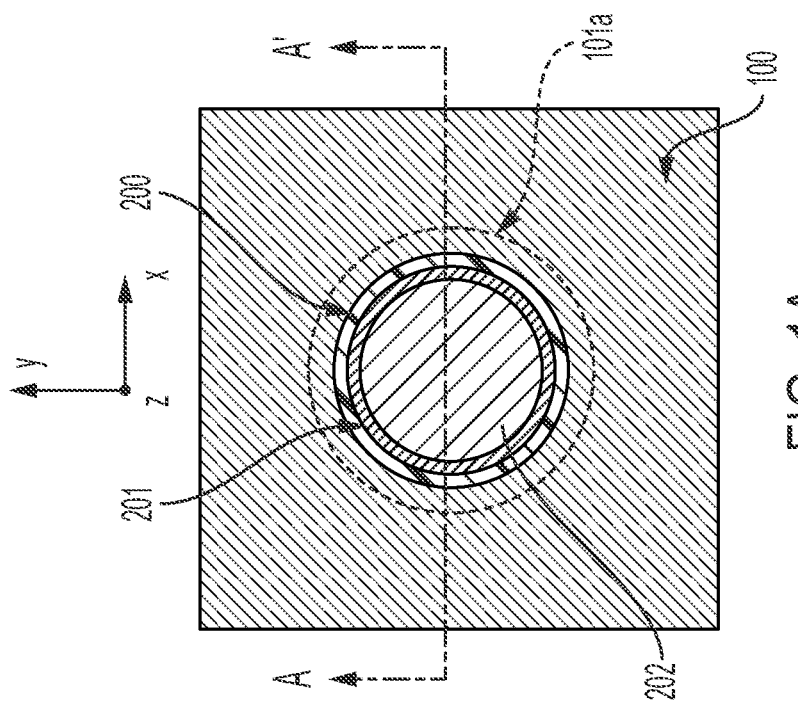
Figure 2B:
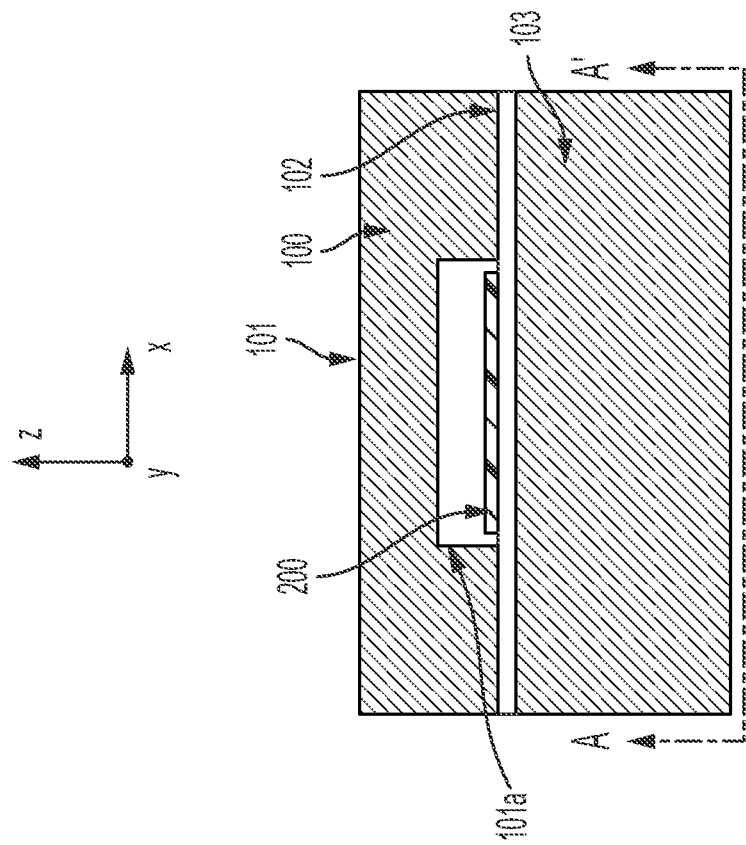
FIGS. 2A and 2B show a conventional circular diaphragm cMUT: (a) in layout form, and (b) in cross-section, respectively.
Figure 2A:
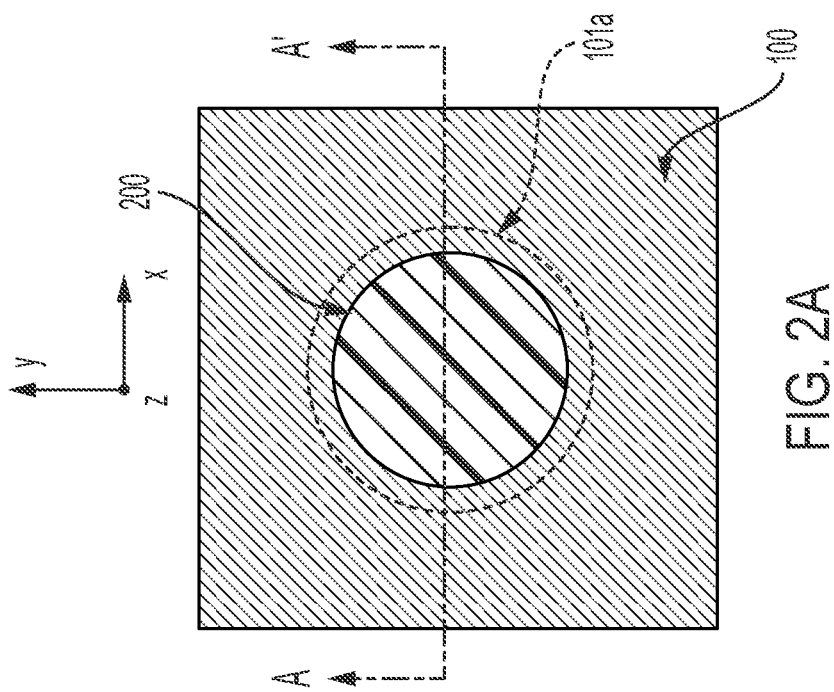
Figure 2D:
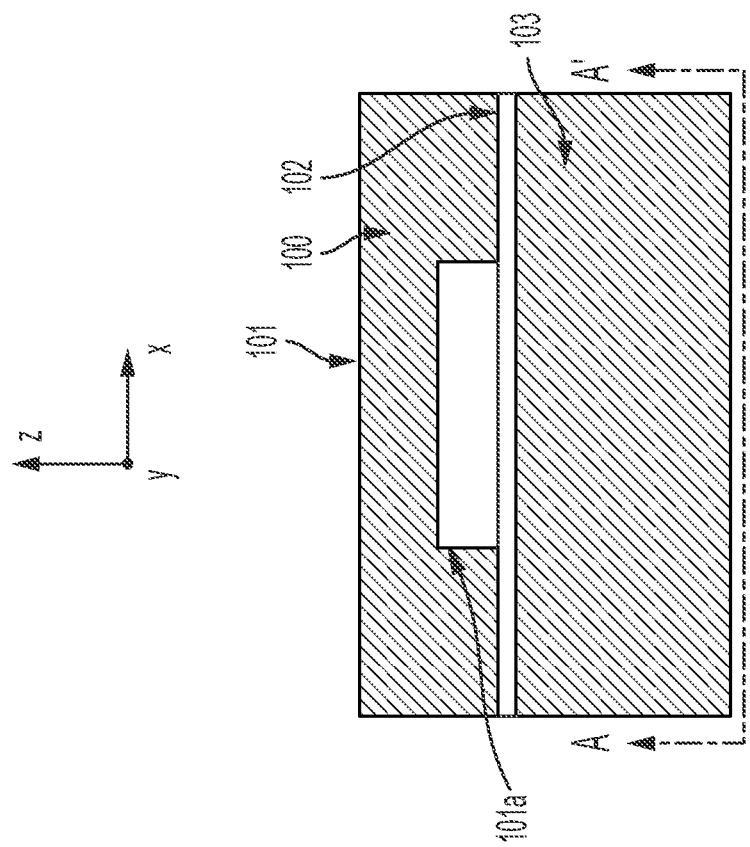
FIGS. 2C and 2D show a conventional circular diaphragm cMUT with a conductive portion at the top of the handle substrate in lieu of a bottom electrode as in the cMUT of FIGS. 2A and 2B: (c) in layout form, and (d) in cross-section, respectively.
Figure 2C:
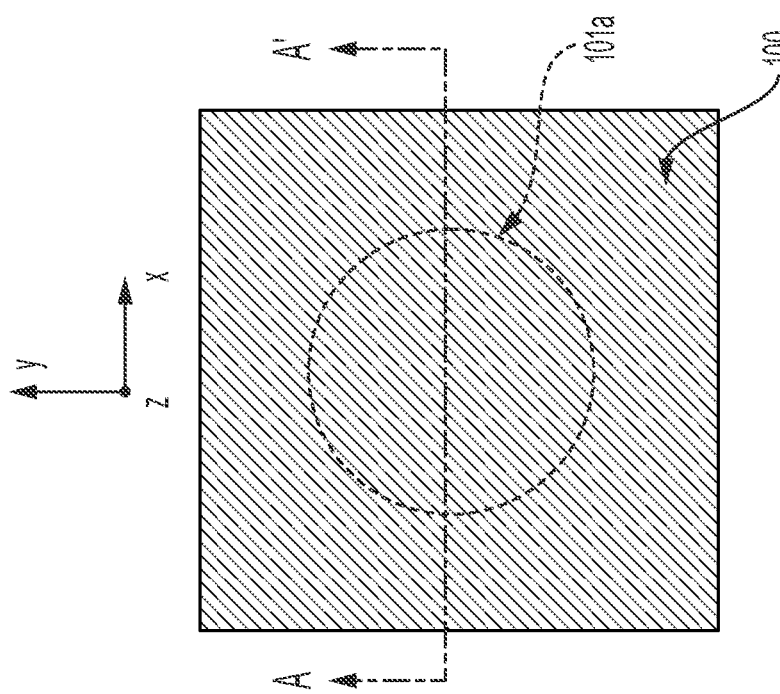

In some embodiments, disclosed herein are micromachined ultrasonic transducers (MUTs) comprising: a diaphragm with substantially free edges; one or more electrodes; and one or more anchors clamping the diaphragm at locations within the diaphragm periphery, along the diaphragm periphery, or both within and along the diaphragm periphery, to a substrate. The diaphragm, the one or more electrodes, and the one or more anchors, can have any shape. In some embodiments, the edges are free and the anchors reside completely within the diaphragm. In some embodiments, the MUT is a pMUT comprising a piezoelectric film. In further embodiments, the one or more electrodes are electrically coupled to the piezoelectric film. In further embodiments, the piezoelectric film is situated opposite the one or more anchors. In other embodiments, the piezoelectric film is situated on the same side as the one or more anchors. In some embodiments, the piezoelectric film is between the one or more anchors and the diaphragm. In some embodiments, the diaphragm comprises a groove. In some embodiments, the MUT comprises a plurality of anchors, wherein a subset of the plurality of anchors are attached to one or more vertical cantilever shells. In some embodiments, the MUT comprises a plurality of anchors, wherein a subset of the plurality of anchors are attached to one or more vertical cantilever shells, and wherein the diaphragm comprises a groove. In some embodiments, the MUT is a cMUT. In further embodiments, the one or more electrodes are electrically coupled to the diaphragm between a gap. In further embodiments, the diaphragm comprises a groove. In still further embodiments, the MUT comprises a plurality of anchors, wherein a subset of the plurality of anchors are attached to one or more vertical cantilever shells. In still further embodiments, the MUT comprises a plurality of anchors, wherein a subset of the plurality of anchors are attached to one or more vertical cantilever shells, and wherein the diaphragm comprises a groove.

In some embodiments, disclosed herein are micromachined ultrasonic transducers (MUTs) comprising a clamped diaphragm comprising a vertical cantilever shell, the vertical cantilever shell attached to an edge of the diaphragm. The diaphragm can have any shape. In some embodiments, the vertical cantilever shell forms a virtual pivot substantially preventing out of plane motion, but allowing for rotation of the diaphragm edge while imparting a counter-torque. In various embodiments, the vertical cantilever shell has a thickness between 0.1 μm and 50 μm, and wherein the vertical cantilever shell has a height between 1 and 100 times greater than its thickness. In still further embodiments, the vertical cantilever shell is not continuous about the diaphragm edge, but has areas with no virtual pivot. In still further embodiments, the MUT is multimodal.

In some embodiments, disclosed herein are micromachined ultrasonic transducers (MUTs) comprising a clamped diaphragm comprising a groove. The clamped diaphragm can have any shape. In some embodiments, the MUT is a pMUT. In various embodiments, the groove is within 20 diaphragm thicknesses of a diaphragm boundary, and wherein the groove has a width no larger than 10 diaphragm thicknesses, and wherein the groove has a depth of between 1% to 100% of the diaphragm thickness. In some embodiments, the groove has a constant width. In other embodiments, the groove has a variable width. In some embodiments, groove is disrupted at one or more locations to allow for electrical routing. In some embodiments, the MUT is multimodal. In some embodiments, the MUT is a cMUT. In various embodiments, the groove is within 20 diaphragm thicknesses of a diaphragm boundary, and wherein the groove has a width no larger than 10 diaphragm thicknesses, and wherein the groove has a depth of between 1% to 100% of the diaphragm thickness. In some embodiments, the groove has a constant width. In other embodiments, the groove has a variable width. In some embodiments, the groove is disrupted at one or more locations to allow for electrical routing. In some embodiments, the MUT is multimodal.

In various embodiments, disclosed herein are MUT arrays configured for ultrasound imaging, wherein the array comprises a plurality of the MUTs described herein. In some embodiments, each MUT of the plurality of the MUTs is a pMUT. In other embodiments, each MUT of the plurality of the MUTs is a cMUT. In some embodiments, each MUT of the plurality of the MUTs comprises a vertical cantilever shell formed from multiple etches.

In various embodiments, disclosed herein are methods of manufacturing the MUTs and MUT arrays described herein.

In particular embodiments, disclosed herein are micromachined ultrasound transducers (MUTs) comprising: a piezoelectric stack comprising a substrate, an insulating layer, a top electrode, a piezoelectric layer, and a bottom electrode, wherein the piezoelectric stack has edge portions and a central portion, wherein the piezoelectric stack has one or more grooves extending through at least the top electrode, piezoelectric layer, bottom electrode, and insulating layer and into at least a portion of the substrate, and wherein the one or more grooves are disposed between the edge portions and the central portion of the piezoelectric stack; a base; one or more anchors coupling the central portion of the piezoelectric stack to the base, leaving the edge portions of the piezoelectric stack free and the central portion of the piezoelectric stack is clamped to the base, the one or more anchors providing an electrical coupling between the base to the piezoelectric stack; and a plurality of conductors, the plurality of conductors comprising (i) a first conductor electrically coupling the top electrode of the piezoelectric stack to the base through a first via through the thickness of the piezoelectric stack and (ii) a second conductor electrically coupling the bottom electrode of the piezoelectric stack to the base through a second via through the thickness of the piezoelectric stack, wherein the first and second vias are disposed between the edge portions and the central portion of the piezoelectric stack.

Certain Definitions

Unless otherwise defined, all technical terms used herein have the same meaning as commonly understood by one of ordinary skill in the art to which this invention belongs. As used in this specification and the appended claims, the singular forms "a," "an," and "the" include plural references unless the context clearly dictates otherwise. Any reference to "or" herein is intended to encompass "and/or" unless otherwise stated.

Overview of Methodology

Three methods for improving the electromechanical coupling coefficient and bandwidth of micromachined ultrasonic transducers, or MUTs, are presented:

1) Forming grooves along the edge of clamped diaphragms to increase the compliance of the diaphragm locally at its edge;

2) Forming a virtual pivot via a vertical cantilever shell that restricts out of plane motion but allows for rotation which is opposed by a counter-torque, thus forming a boundary condition similar to a simply supported edge restrained by torsion springs; and 3) Forming diaphragms with largely free edges, and clamped at one or more locations within the diaphragm or at its periphery.

Diaphragm with Edge Groove

Herein we disclose a methodology to reduce the rigidity of the diaphragm near the diaphragm edge by etching a groove near the diaphragm edge. This results in a diaphragm with boundaries that behave in between a clamped edge and a simply supported edge with torsional springs. This "edge groove" promotes piston like motion, better coupling, and wider bandwidth.

As illustrated in FIGS. 5a-5b and 6a-6b, this edge groove 300 can be applied to both pMUT and cMUT embodiments. To be effective, it should be within approximately five diaphragm thicknesses of the diaphragm edge 101a. The width of the groove influences the rigidity, with wider grooves promoting simply supported behavior, while at the same time reducing the flexural rigidity of the plate, and thus shifting its frequency more.

Diaphragm with Virtual Pivot

We further disclose a methodology to form a "virtual pivot" that behaves similarly to a simply supported edge restrained by torsional springs. This is accomplished by forming a vertical cantilever shell at the diaphragm edge. This cantilever shell is very stiff to vertical displacements, effectively preventing displacement in the z-direction. The cantilever shell is relatively compliant with respect to torsion at the diaphragm edge, allowing rotation, but imparting a counter-moment based on the shell's dimensions. The cantilever shell is also susceptible to lateral displacement in x and y via outside lateral forces. In the absence of such lateral forces, thus, the cantilever shell prevents displacement of the diaphragm edge while allowing rotation and imparting a counter-moment.

Figure 7A:
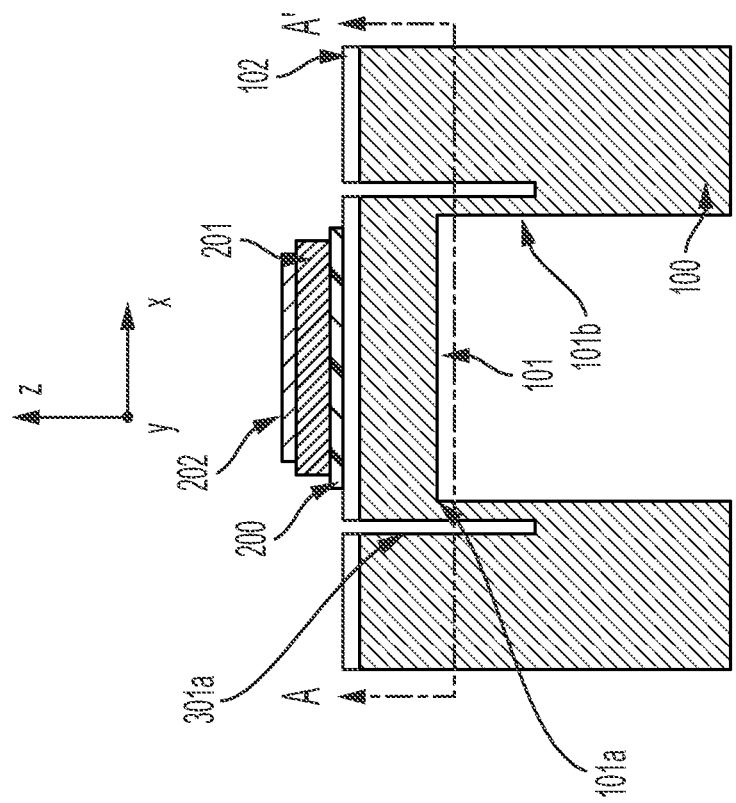
FIGS. 7A and 7B show an exemplary circular diaphragm pMUT with a topside virtual pivot etch: (a) in layout form, and (b) in cross-section, respectively.
Figure 7B:
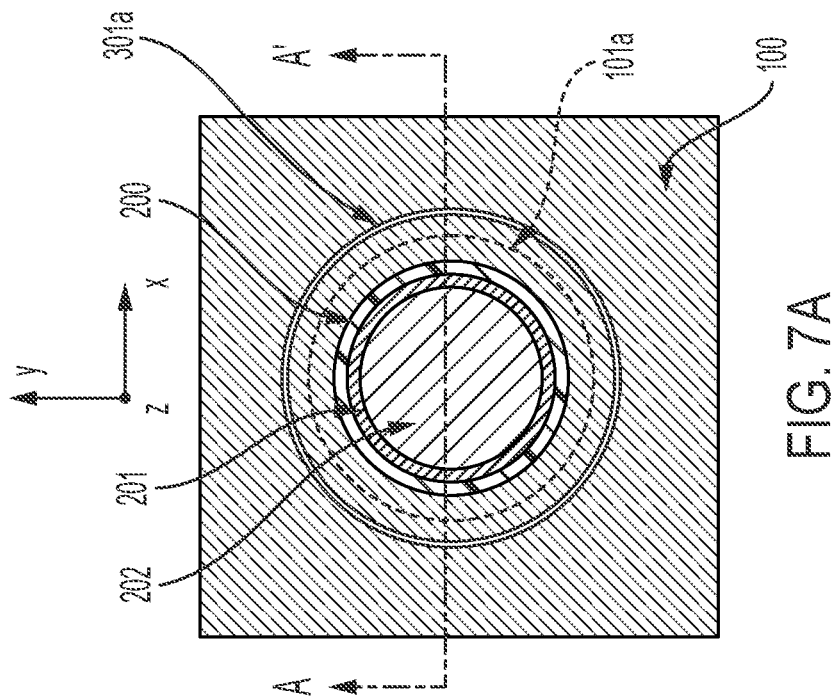
Figure 7C:
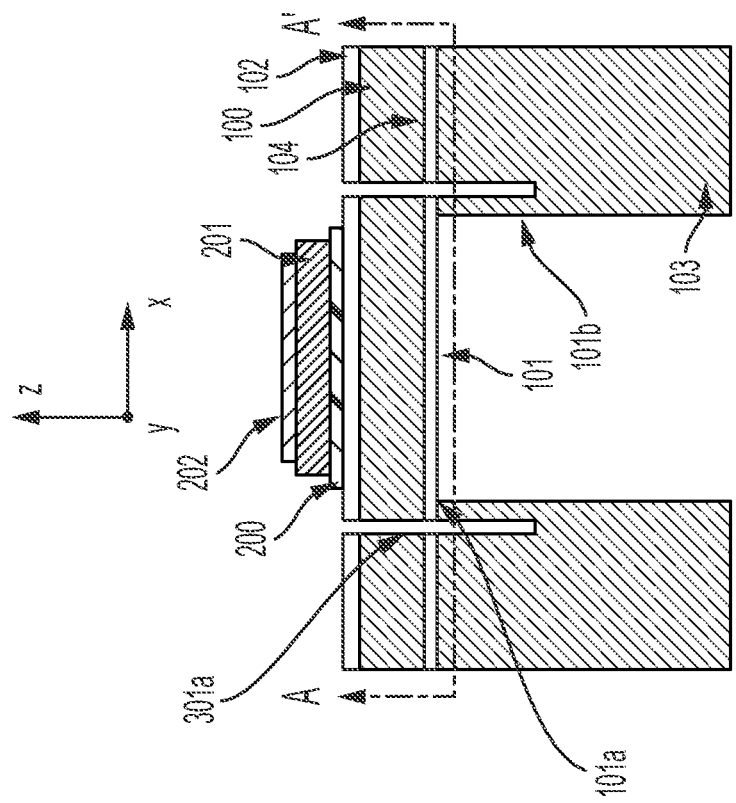
FIGS. 7C and 7D show an exemplary circular diaphragm pMUT with a topside virtual pivot etch and using a silicon on insulator (SOI) wafer, including a buried oxide layer between the device and handle layers, which makes the cavity etch in the handle substrate more manufacturable: (c) in layout form, and (d) in cross-section, respectively.
Figure 7D:
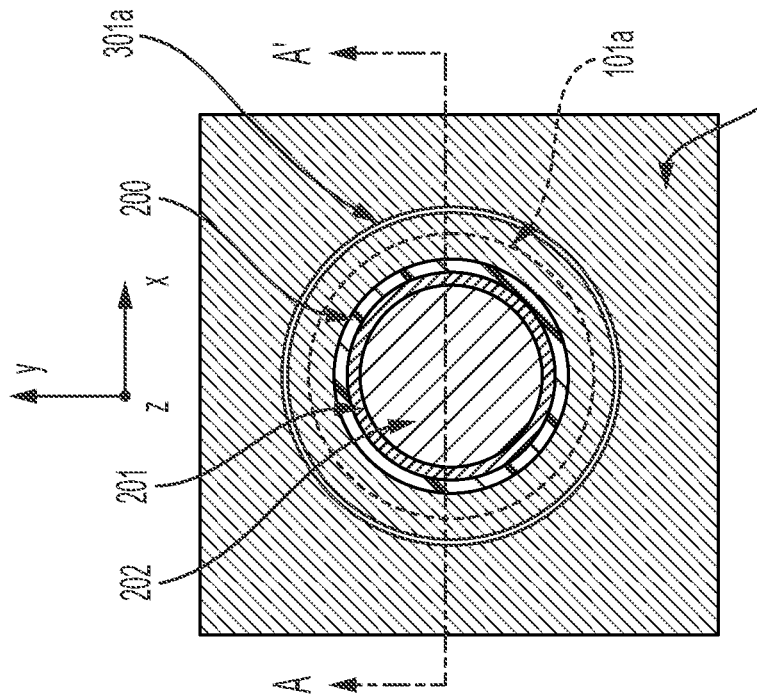

The formation of the cantilever shell can be accomplished in many manners. One example for a pMUT is depicted in FIGS. 7a and 7b, in which a virtual pivot trench 301a is etched outside the diaphragm edge 101a, and deeper than the diaphragm thickness. The cantilever shell is formed by the remaining material between the virtual pivot etch 301a and the cavity in 100 that forms the diaphragm 101. The properties of the virtual pivot (e.g., the stiffness of the torsional springs, its resistance to lateral forces, etc.) are dictated by the dimensions of the cantilever shell. The longer and thinner the shell, the more compliant the virtual pivot.

Figure 8C:
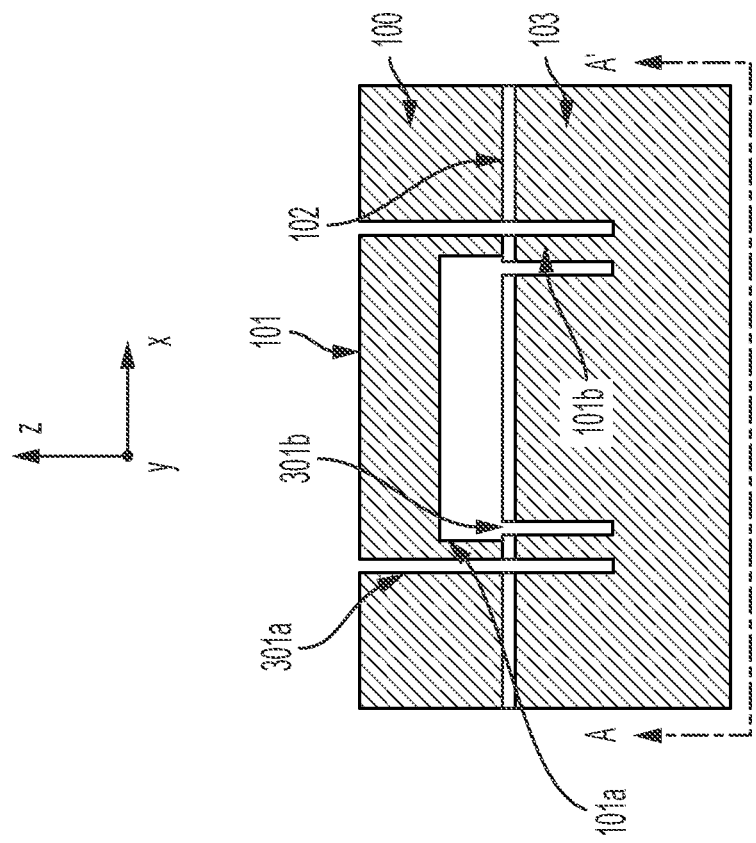
FIGS. 8C and 8D show an exemplary circular diaphragm cMUT with a topside virtual pivot etch and with a conductive or semi-conductive portion at the top of the handle substrate in lieu of a bottom electrode as in the cMUT of FIGS. 8A and 8B: (c) in layout form and (d) in cross-section, respectively.
Figure 8D:
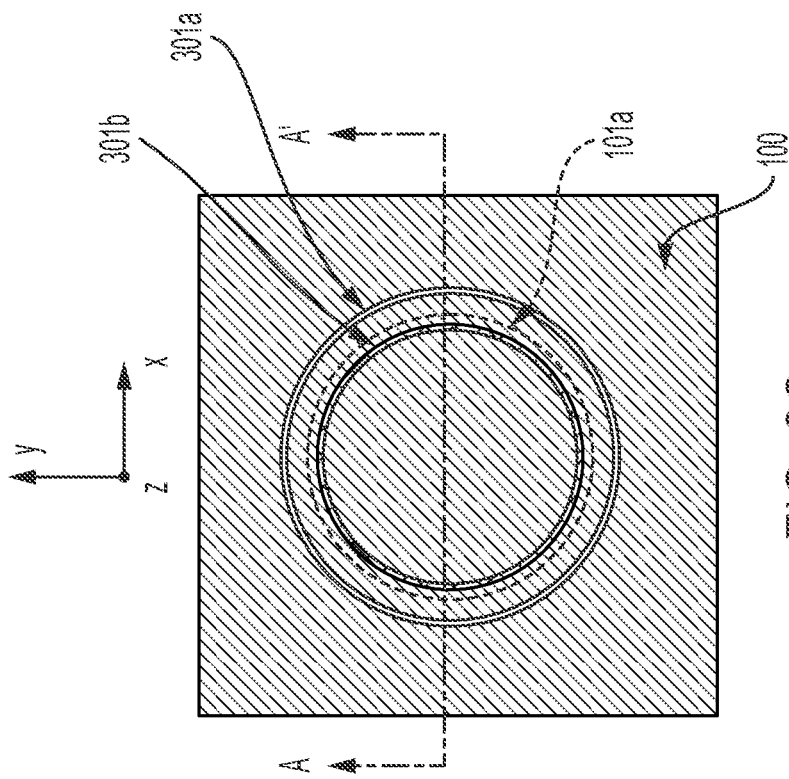

A similar approach can be used for cMUTs, as illustrated in FIGS. 8a and 8b. A virtual pivot trench 301a is etched around the periphery of the diaphragm. For most common cMUT constructions, the cavity formed between the diaphragm 101 and the bottom electrode is very narrow. With a single virtual pivot trench 301a, the resulting cantilever shell 10b will be short and wide resulting in very stiff torsional springs. To create a more compliant cantilever shell 101b, a second virtual pivot trench 301b can be etched inside the first trench 301a, with both trenches extending through the dielectric layer 102 and into the handle substrate 103. This will provide a more compliant virtual pivot.

Diaphragms of Arbitrary Shape with Edge Grooves

Figure 9A:
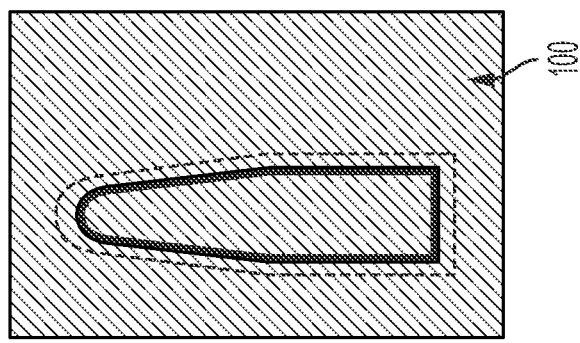
FIGS. 9A-9D show exemplary variations on edge grooves: (a) arbitrary diaphragm shape, (b) multiple grooves, (c) grooves of variable width, and (d) select areas without grooves, respectively. For simplicity, only the diaphragm edges (dashed lines) and grooves (solid lines) are shown.
Figure 9B:
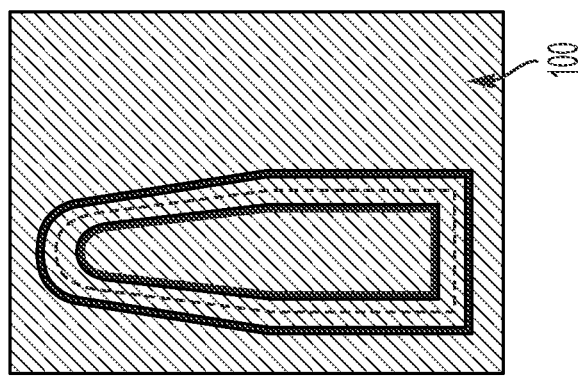
Figure 9C:
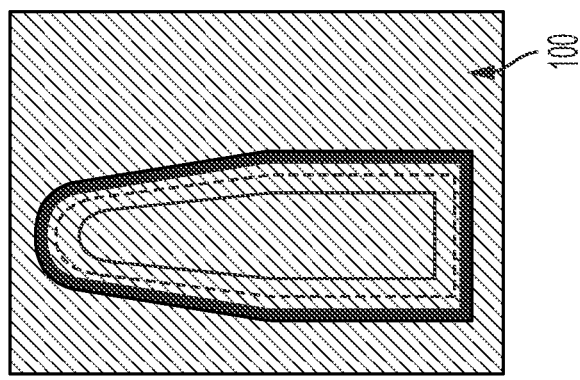
Figure 9D:
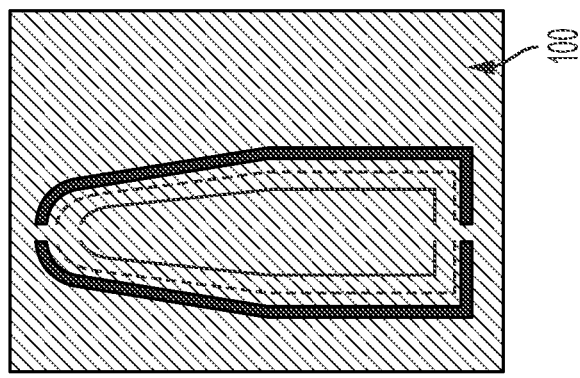

In light of the disclosure herein, it will be clear to one skilled in the art that the basic design feature of edge grooves can be applied to arbitrary diaphragm shapes, as depicted in FIG. 9A. It is also possible to vary the number and location of grooves (FIG. 9B), as well as the width of the grooves (FIG. 9C). Indeed, the edge grooves do not have to be a uniform width to provide a beneficial effect. For the practical purpose of routing electrical signals, it may be necessary to break grooves up in select areas without losing the overall benefit of the grooves (FIG. 9D).

Diaphragms of Arbitrary Shape with Virtual Pivots

Similarly, in light of the disclosure herein, it will be apparent to one skilled in the art that the basic design feature of the virtual pivot can be applied to arbitrary diaphragm shapes, as depicted in FIG. 10A. It is also possible to vary the number and location of virtual pivot etches (FIG. 10B), as well as the width of the etches (FIG. 10C). Even more so than the grooves, virtual pivot etches do not require a uniform width to accomplish their intended function. As with the grooves, the virtual pivot trenches can be broken up in select areas to allow for such tasks as electrical routing (FIG. 10D).

Diaphragm with Free Edges and a Clamped Central Area

Figure 3:
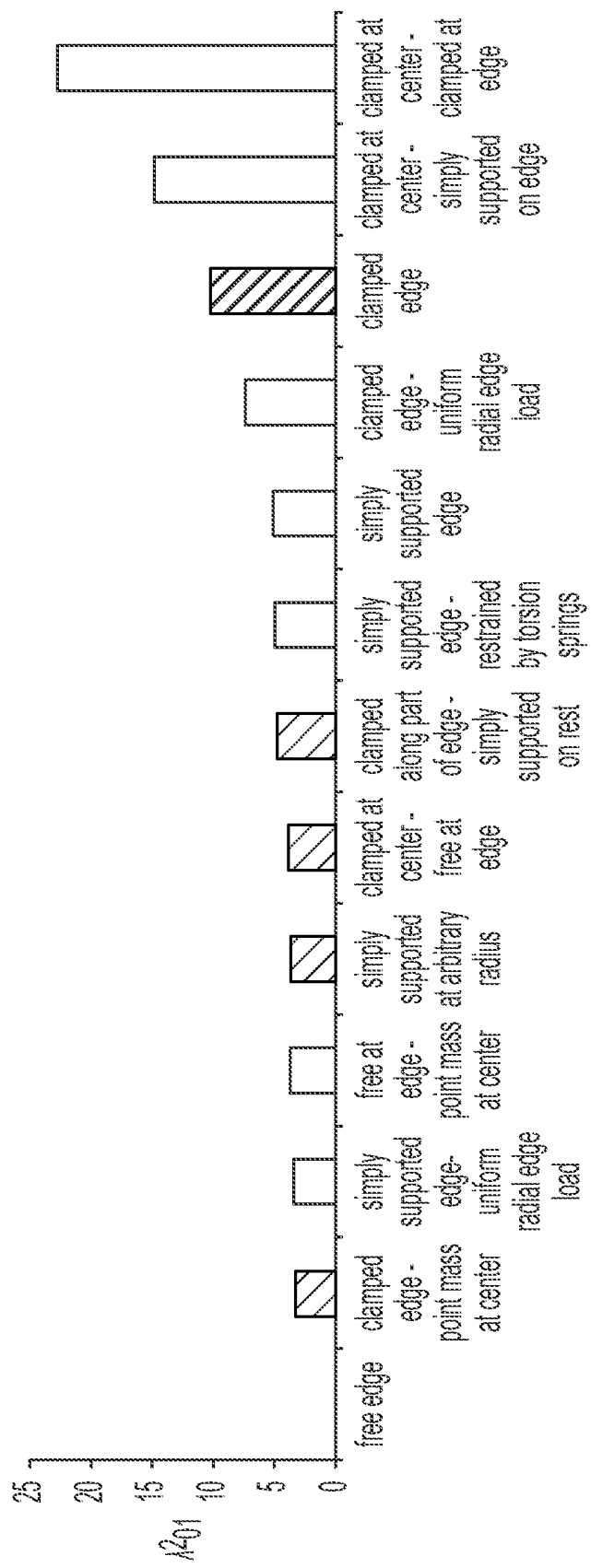
FIG. 3 is a bar chart showing a natural frequency parameter of the fundamental mode, λ.01, as a function of boundary conditions. Interpreted by [2] from [1]. The cross-hatching with thick lines indicates the most common MUT edge condition: clamped. The cross-hatching with thin lines indicates boundary conditions that [2] assumes to be "physically realizable."
Figure 4:
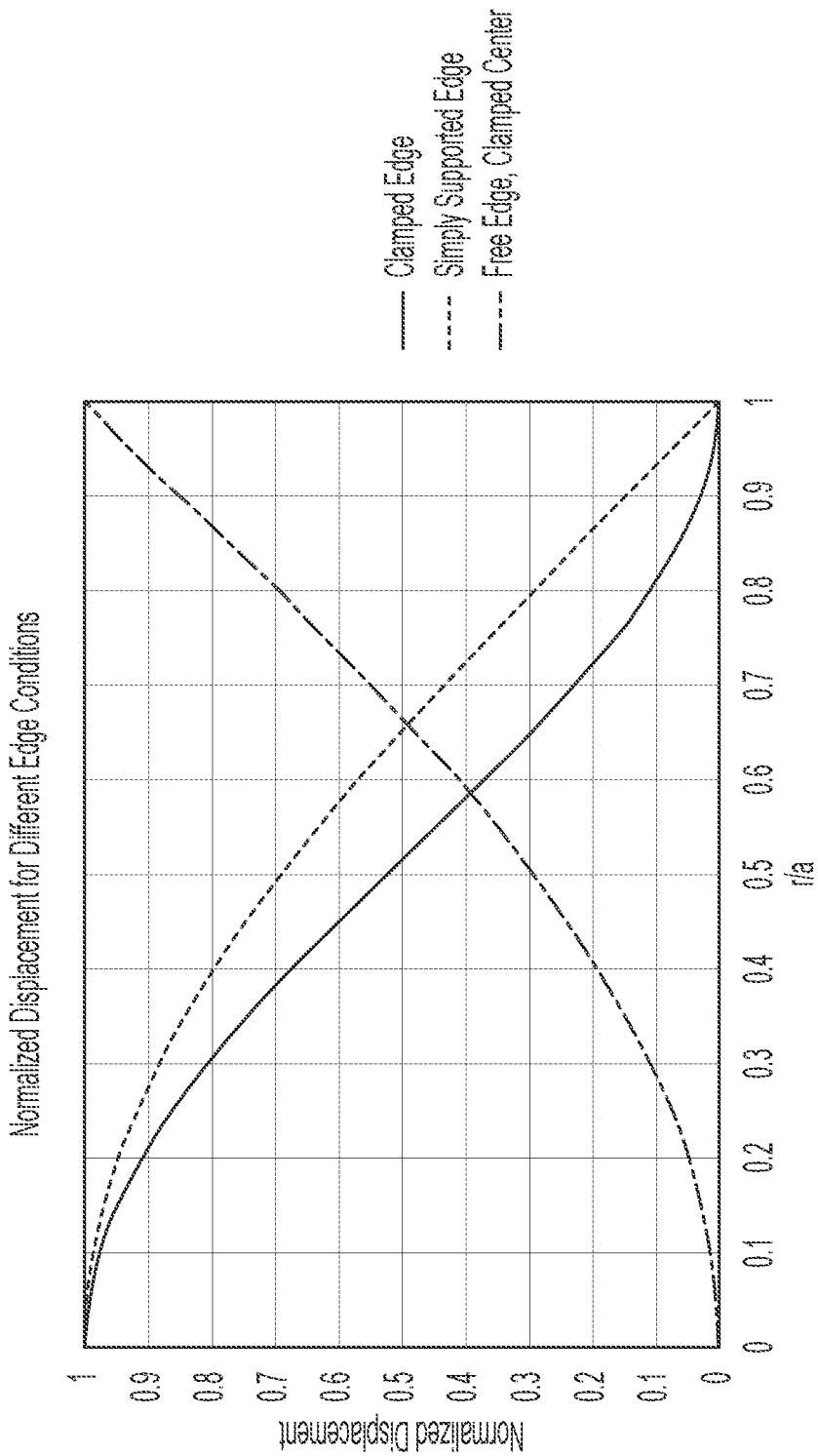
Figure 5B:
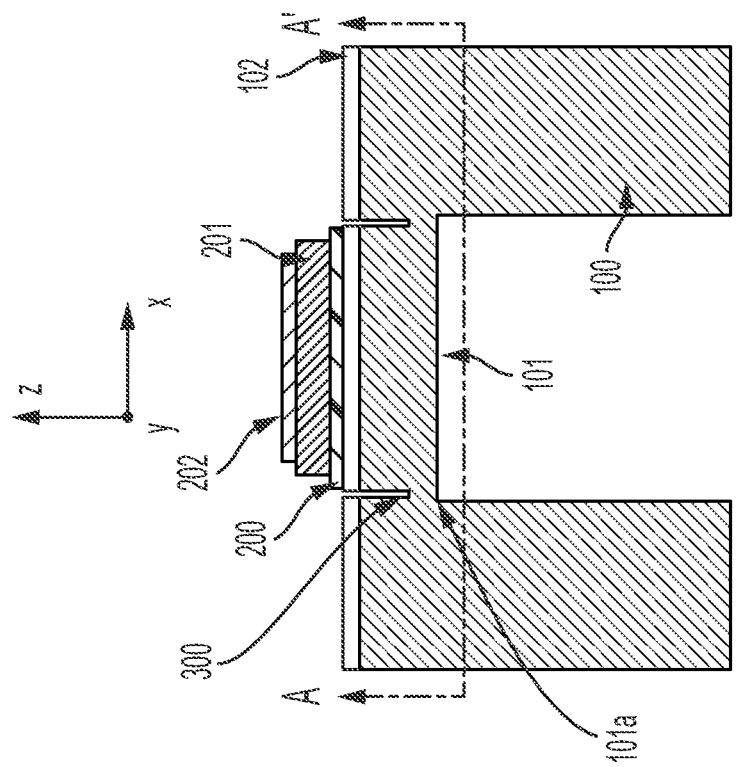
FIGS. 5A and 5B show an exemplary circular diaphragm pMUT with a topside groove: (a) in layout form, and (b) in cross-section, respectively.
Figure 5A:
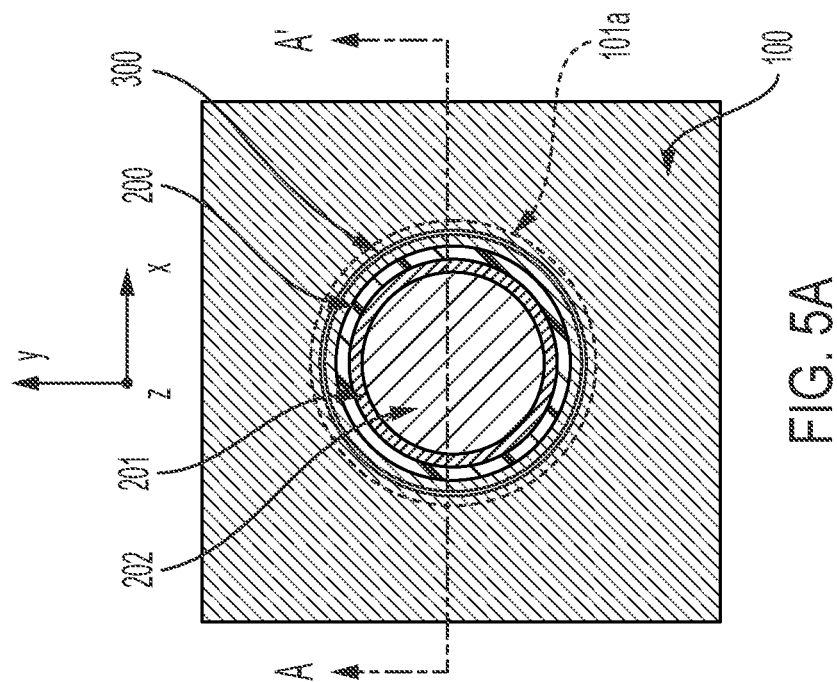

To further increase the electromechanical coupling coefficient and broaden the bandwidth, we disclose a design methodology wherein the diaphragm largely has free edges, and is clamped arbitrarily in the center by one or more anchors. This design has benefits similar to the free edges clamped center design mentioned in FIG. 3.

Figure 11B:
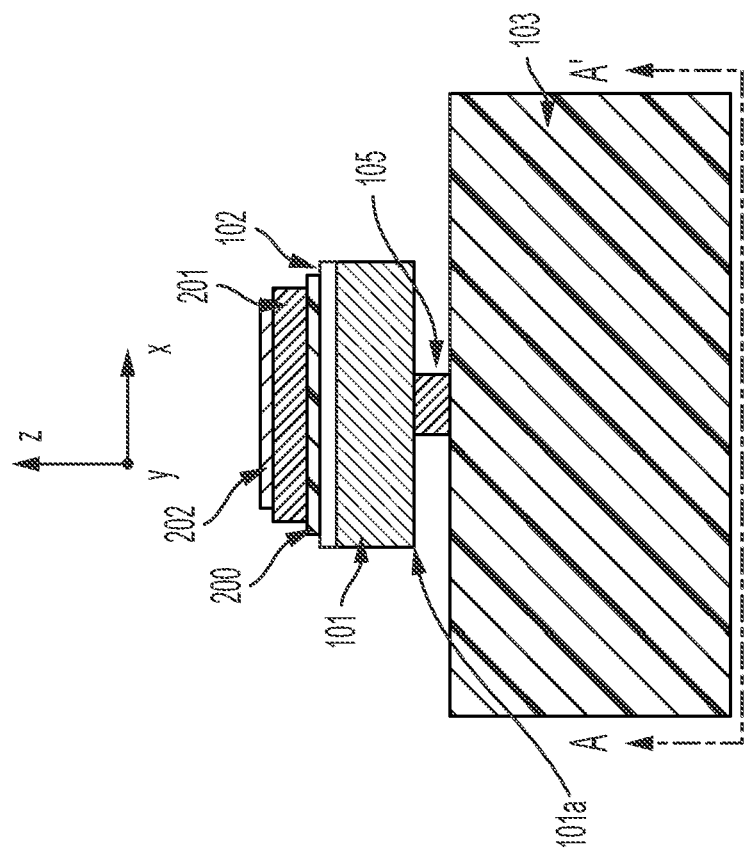
FIGS. 11A and 11B show an exemplary pMUT with free edges and a clamped center, and the piezoelectric stack opposite the anchor: (a) in layout form, and (b) in cross-section, respectively.
Figure 11A:
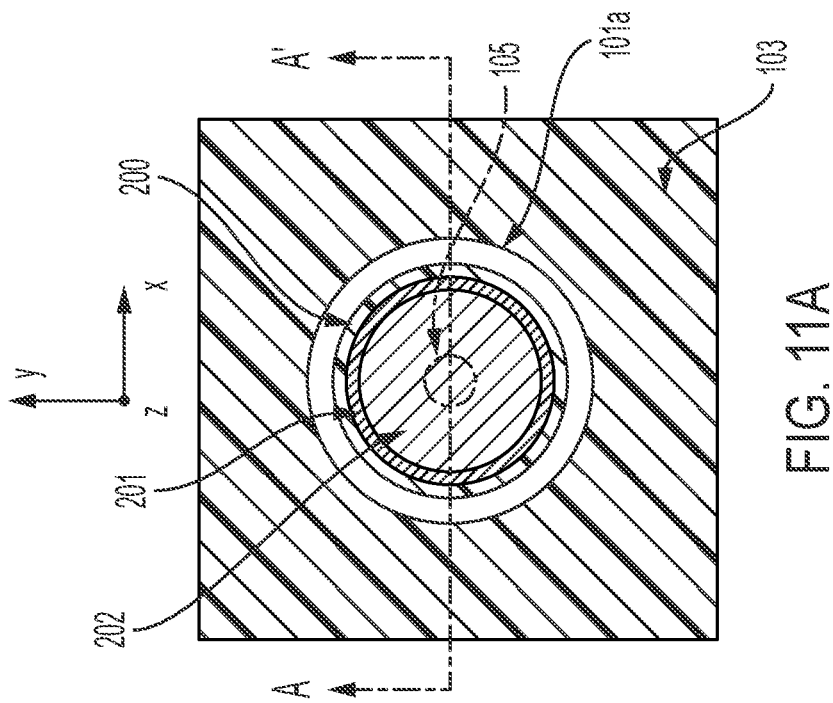
Figure 12B:
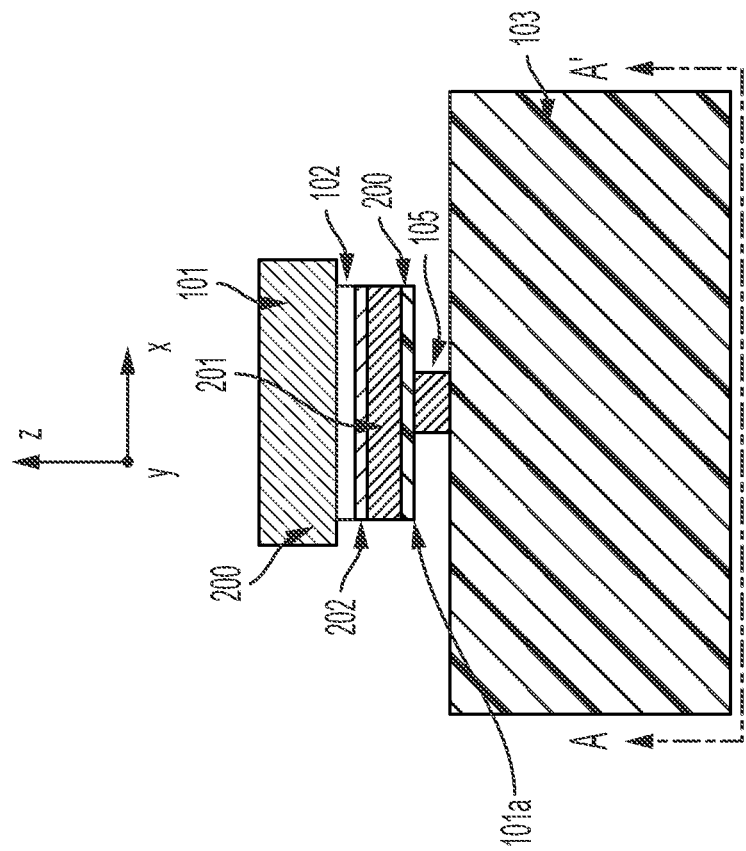
FIGS. 12A and 12B show an exemplary pMUT with free edges and a clamped center, and the piezoelectric stack on the same side as the anchor: (a) in layout form, and (b) in cross-section, respectively.
Figure 12A:
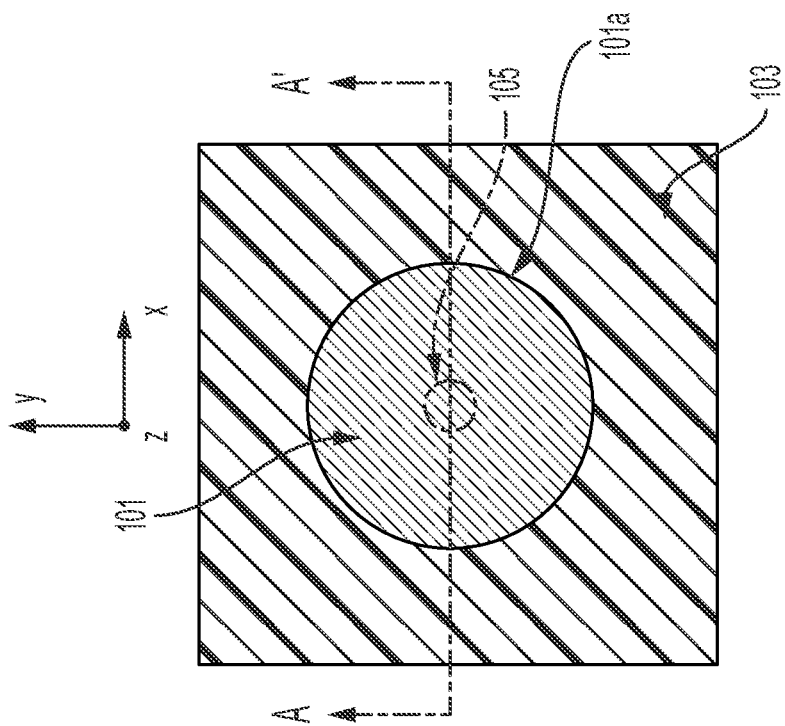

FIGS. 11a and 11b depict a representative embodiment in the form of a pMUT with a circular diaphragm 101 and central anchor 105, atop a handle substrate 103. In this case, the piezoelectric stack (bottom electrode 200, piezoelectric film 201, and top electrode 202) sits atop the dielectric film 102 on the diaphragm 101. FIGS. 12a and 12b depict another pMUT configuration in which the piezoelectric stack sits between the diaphragm 101 and anchor 105.

Figure 13B:
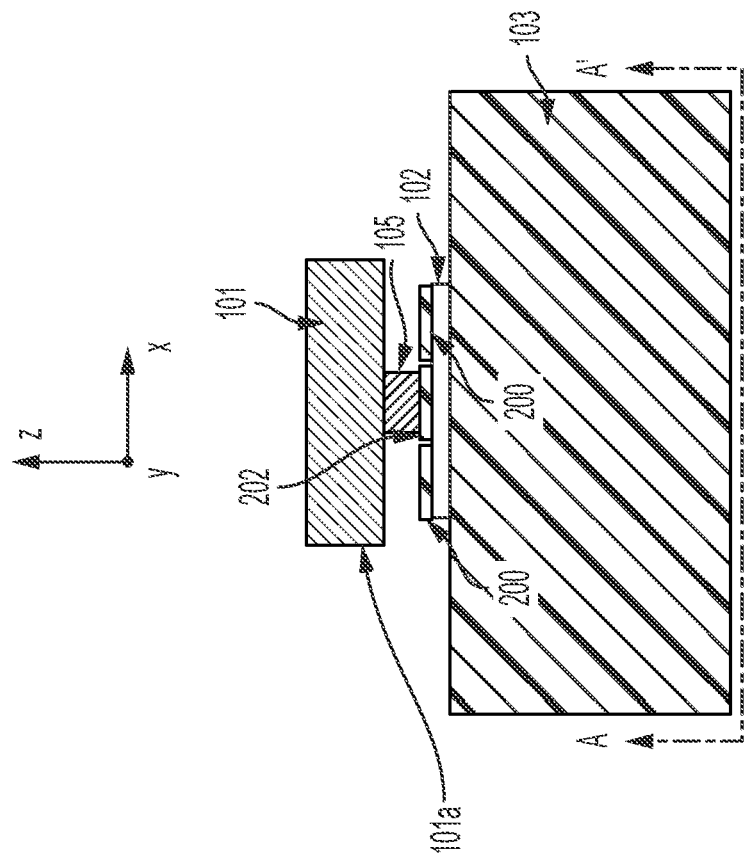
FIGS. 13A and 13B show an exemplary cMUT with free edges and a clamped center, and the opposing electrode situated between the substrate and diaphragm (which is assumed to be conductive in this example embodiment): (a) in layout form, and (b) in cross-section, respectively.
Figure 13A:
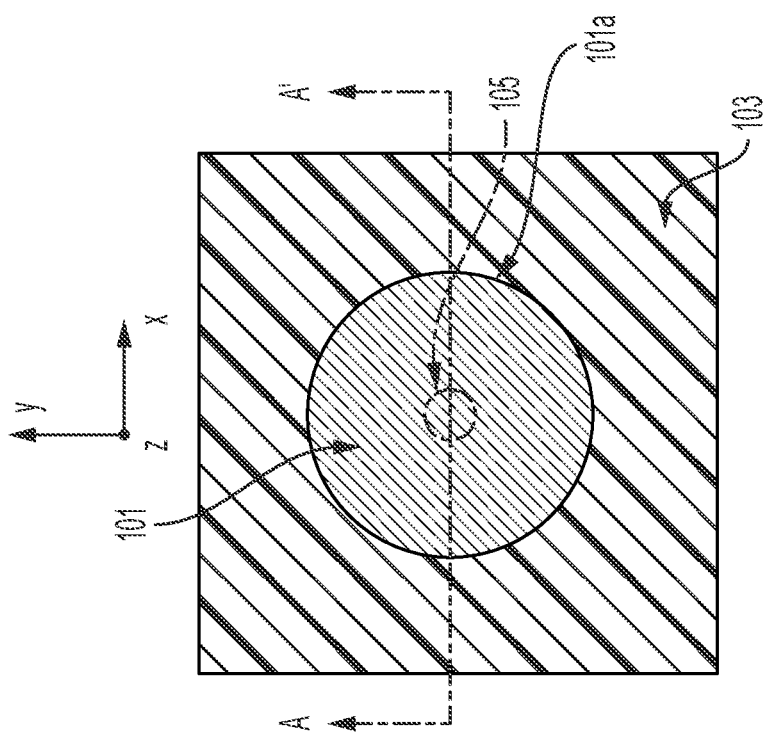

FIGS. 13a and 13b depict a similar configuration cMUT, in which electrode 200 and 202 sit atop a dielectric film 102 on a handle substrate 103. An anchor 105 attaches the electrode 202 to the diaphragm 101. Many configurations are possible to create a diaphragm with free edges, fixed at one or more anchors, that forms a capacitor of two electrodes spaced from one another.

Arbitrary Shaped Diaphragm with Free Edges Clamped at One or More Arbitrary Areas Interior or Attached to Free Edges, with Arbitrarily Shaped Electrodes In light of the disclosure herein, it will be apparent to one skilled in the art that the concept of a free edged MUT can be applied to arbitrarily shaped diaphragms, with one or more arbitrarily shaped clamped areas, with arbitrarily shaped top and bottom electrodes. FIGS. 14a-14c provide a few examples of such variations. Importantly, it is possible to overlap the anchor with the edge of the diaphragm to produce a diaphragm with varying free and clamped boundaries, as exemplified in FIG. 14d.

Combining Edge Grooves and Virtual Pivots

In light of the disclosure herein, it will be apparent to one skilled in the art that the concept of edge grooves and virtual pivots can be combined to create an edge condition even more compliant than either one of the concepts applied alone. Examples of a pMUT and cMUT configured with both inventions are illustrated in FIGS. 15a-15d and FIGS. 16a-16d, respectively.

Combining Free Edges, Edge Grooves and Virtual Pivots

In light of the disclosure herein, it will similarly be apparent to one skilled in the art that the concept edge grooves and virtual pivots, together or separately, can be applied to the free edge MUT invention. FIGS. 17a-17b, 18a-18b, and 19a-19b illustrate this concept, respectively, for a pMUT with the piezoelectric stack atop the diaphragm 101, a pMUT where the piezoelectric stack sits between the diaphragm 101 and anchor 105, and a cMUT.

Method of Manufacture for pMUT with Grooves and Virtual Pivot

An exemplary method of manufacture for a pMUT with grooves and virtual pivot(s), such as the pMUT show by FIGS. 15a-b and 15c-d is now described.

(a) First, a substrate, typically single crystal silicon, is provided.

(b) The insulating layer 102 can then be deposited over the substrate. The insulating layer 102 is typically some form of $SiO_2$, about 0.1 μm to 3 μm thick. It is commonly deposited via thermal oxidation, PECVD deposition, or other technique.

(c) A first metal layer 200 (also referred to as M1 or metal 1) can then be deposited. Typically, this is a combination of films that adhere to the substrate, prevent diffusion of the piezoelectric, aid the piezoelectric in structured deposition/growth, and which is conductive. SRO ($SrRuO_3$) may be used for structured film growth, on top of Pt for a diffusion barrier and conduction, on top of Ti as an adhesive layer (for Pt to $SiO_2$). Usually, these layers are thin, less than 200 nm, with some films 10 to 40 nm. Stress, manufacturing, and cost issues will usually limit this stack to less than 1 μm. The conductor (Pt) is typically thicker than the structuring layer (SRO) and adhesion layer (Ti). Other common structuring layers, rather than SRO, include $(La_{0.5}Sr_{0.5})CoO_3$, $(La_{0.5}Sr_{0.5})MnO_3$, $LaNiO_3$, $RuO_2$, $IrO_2$, $BaPbO_3$, to name a few. Pt can be replaced with other conductive materials such as Cu, Cr, Ni, Ag, Al, Mo, W, and NiCr. These other materials usually have disadvantages such as poor diffusion barrier, brittleness, or adverse adhesion, and Pt is the most common conductor used. The adhesion layer, Ti, can be replaced with any common adhesion layers such as TiW, TiN, Cr, Ni, Cr, etc.

(d) A piezoelectric material 201 can then be deposited. Some common examples of suitable piezoelectric materials include: PZT, KNN, PZT-N, PMN-Pt, AlN, Sc—AlN, ZnO, PVDF, and $LiNiO_3$. The thicknesses of the piezoelectric layer may vary between 100 nm and 5 μm or possibly more.

(e) A second metal layer 202 (also referred to as M2 or metal 2) can then be deposited. This second metal layer 202 may be similar to the first metal layer 200 and may serve similar purposes. For M2, the same stack as M1 may be used, but in reverse: Ti for adhesion on top of Pt to prevent diffusion on top of SRO for structure.

(f) The second metal layer or M2 202 may then be patterned and etched, stopping on the piezoelectric layer. Etches can be made in many ways herein, for example, via RIE (reactive ion etching), ion mill, wet chemical etching, isotropic gas etching, etc. After patterning and etching, the photoresistor used to pattern M2 may be stripped, via wet and/or dry etching. In many embodiments for manufacturing cMUTs and pMUTs described herein, any number of ways of etching may be used, and the photoresist is typically stripped after most pattern and etch steps.

(g) The piezoelectric layer may then be similarly patterned and etched, stopping at the first metal layer or M1 200. Typically, wet, RIE, and/or ion mill etches are used.

(h) The first metal layer or M1 100 may then be similarly patterned and etched, stopping on the dielectric 102.

(i) If desired, one or both of the following may be added:
(1) An $H_2$ barrier. $H_2$ diffusion into the piezoelectric layer can limit its lifetime. To prevent this, an $H_2$ barrier can be used. 40 nm of ALD (atomic layer deposition) aluminum oxide (Al2O3) may be used to accomplish this. Other suitable materials may include SiC, diamond-like carbon, etc.
(2) A redistribution layer (RDL). This layer can provide connectivity between M1 and M2 and other connections (e.g., wirebonds, bump bonds, etc.). An RDL can be formed by first adding a dielectric such as oxide, etching vias in the dielectric, depositing a conductor (typically Al), and finally patterning the conductor. Additionally, one might add a passivation layer (typically oxide+nitride) to prevent physical scratches, accidental shorting, and/or moisture ingress.

(j) The grooves 300 may then be pattenered. The dielectric layer 102 may be etched via RIE or wet etching. The substrate 100 may be etched, and as the substrate 100 is typically silicon, the etch is typically DRIE (deep reactive ion etching). These grooves 300 can have lateral dimensions between 100 nm and 1000 μm but are typically between 2 μm and 10 μm. The grooves 300 can have any depth from 0.1% to 100% of the device 100 thickness, but typically ranges from 25% to 75% of the device 100 thickness.

(k) The virtual pivot 301*a* may be patterned and etched. The dielectric layer 102 may be etched via RIE or wet etching. The substrate 100 is typically silicon, and may be etched typically via DRIE (deep reactive ion etching). These virtual pivots 301*a* can have lateral dimensions between 100 nm and 1000 μm, but are typically between 2 μm and 10 μm. The virtual pivots can have any depth from 0.1% to 99.9% of the handle 103 thickness, but typically ranges from 10% to 50% of the handle 103 thickness (approximately 10 μm to 100 μm).

Figure 15D:
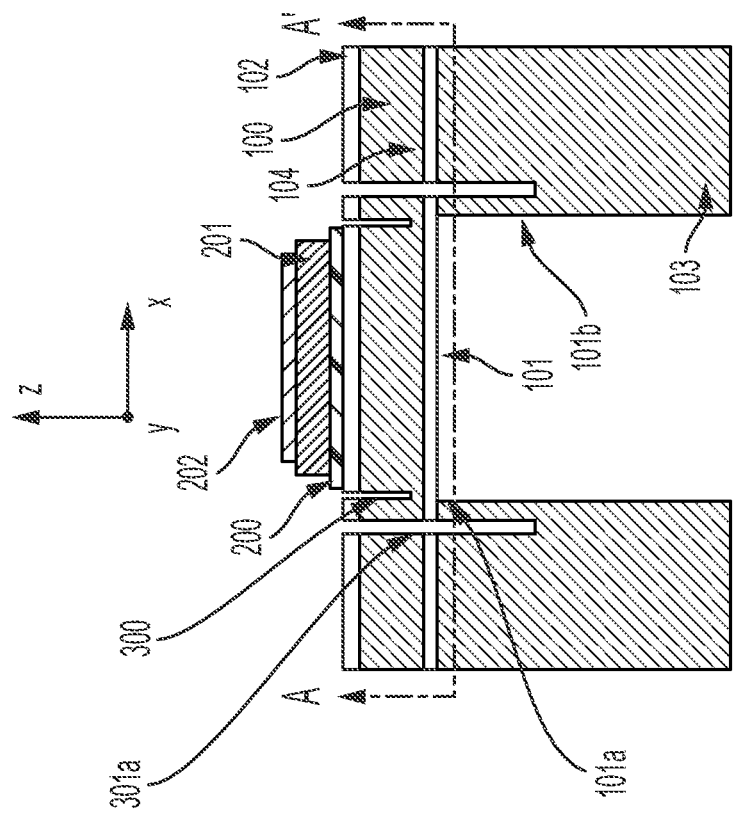
FIGS. 15C and 15D show an exemplary circular diaphragm pMUT with both edge groove and virtual pivot etches and using a silicon on insulator (SOI) wafer, including a buried oxide layer between the device and handle layers, which makes the cavity etch in the handle substrate more manufacturable: (c) in layout form, and (d) in cross-section, respectively.
Figure 15C:
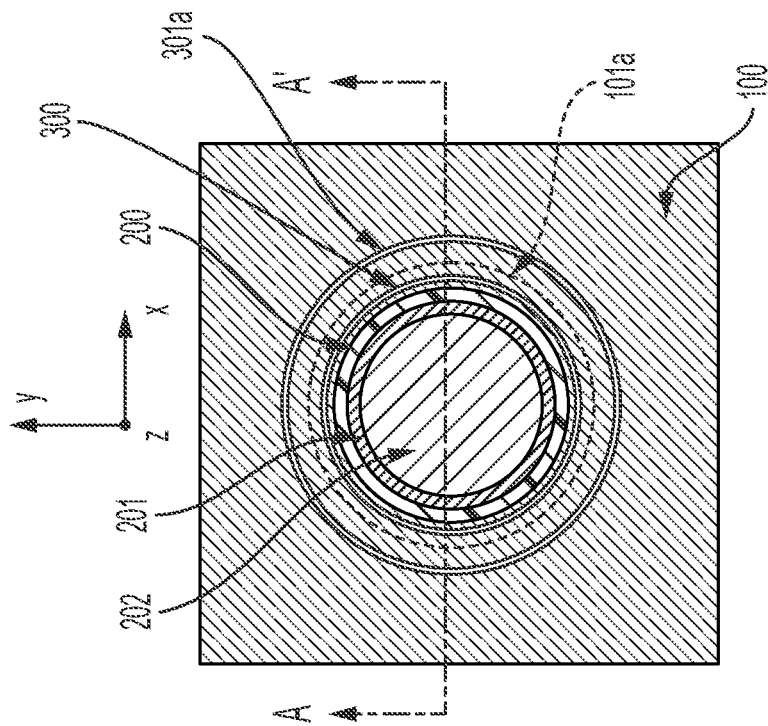

(l) Frequently, an SOI substrate is used, as shown in FIGS. 15*c*-15*d*. In this case, there is a buried insulator layer or BOX layer 104 just below the diaphragm 101. The diaphragm is then composed of the "device" layer 100 (layer above the BOX), and the "handle" layer 103 under the BOX layer. The cavity in 100 may stop on the BOX and may be etched out of the Handle layer 103. In this case, the 301*a* etch may include two extra steps: (1) etching the BOX (typically via dry RIE etching, or in some cases, via wet etching) after the device layer is etched via DRIE, and (2) etching the handle layer via DRIE to the desired depth. Most SOI wafers are silicon, meaning that the device and handle layers will typically be single crystal silicon. The insulator BOX, in this case, is typically a silicon dioxide thermally grown, which is called a "buried oxide", which is where the term "BOX" comes from. A silicon SOI wafer with single crystal silicon handle and device layers with an oxide BOX may typically be used. The device layer may be 5 μm, but typically varies between 100 nm and 100 μm, while the handle layer thickness typically varies between 100 μm and 1000 μm. The BOX is typically between 100 nm and 5 μm, but 1 μm may be used, in many cases.

(m) If desired, the backside of the wafer or handle can be thinned via grinding and optionally polished at this point. In many embodiments, the handle layer is thinned from 500 μm to 300 μm thick. Common thicknesses typically vary between 50 μm and 1000 μm.

(n) The cavity may be patterned on the backside of the wafer or Handle, and the cavity may be etched. Typically, the wafer/handle is composed of silicon, and the etch is accomplished with DRIE. The etch can be timed in the case of FIGS. 15*a*-15*b*. The etch may stop selectively on the BOX in FIGS. 15*c*-15*d*. The cavity can be etched via other techniques such as KOH, TMAH, HNA, and RIE. The wafer can be considered complete after photoresist strip.

Method of Manufacture for pMUT with Grooves

An exemplary method of manufacture for a pMUT with grooves, such as the pMUT shown by FIGS. 5*a*-5*d*, is also provided. This method may be similar to the above method of manufacture for a pMUT with grooves and virtual pivot(s) (FIGS. 15*a*-15*b* and 15*c*-15*d*), except that step (k), the patterning and etching of the virtual pivots, is typically skipped.

Method of Manufacture for pMUT with Virtual Pivot

An exemplary method of manufacture for a pMUT with cantilever shells, such as the pMUT shown by FIGS. 7*a*-7*d*, is also provided. This method may be similar to the above method of manufacture for a pMUT with grooves and virtual pivot(s) (FIGS. 15*a*-15*b* and 15*c*-15*d*), except that step (j), the patterning and etching of the grooves, is typically skipped.

Method of Manufacture for cMUT with Grooves and Virtual Pivot

An exemplary method of manufacture for a cMUT with grooves and virtual pivot(s), such as the cMUT shown by FIGS. 16*e* and 16*f*, is now described.

(a) The method typically starts with a substrate which will become the handle 103. Typically, this substrate is single crystal silicon.

(b) A shallow cavity may then be patterned and etched. This cavity is typically 10 nm to 5 μm, most commonly between 100 nm and 1 μm. For the common single crystal silicon substrate, this cavity is a timed etch using DRIE, RIE, HNA, or oxidation.

(c) The insulating layer 102 may then be deposited. Typically, this insulating layer is some form of $SiO_2$, about 0.1 μm to 3 μm thick. It is commonly deposited via thermal oxidation, and in some cases via PECVD or LPCVD deposition, or some other technique.

(d) A metal layer or conductor 200 may then be deposited, examples of such a conductor include as Al, Au, Cr, Cu, Pt etc. This conductor may be on an adhesion layer and/or diffusion barrier layer such as Ti, TiW, TiN, Cr, etc.

(e) The conductor (and adhesion and/or diffusion barrier layers) may be patterned and etch, stopping on the insulator.

(f) The virtual pivots 301*b* and bottom portion of the virtual pivots 301*a* may be patterned and etched. First, the insulator 102 may be etched via RIE, wet etch or another technique. Next, the handle 103 may be etched. Typically, the handle 103 is silicon, and this etching is made via DRIE, and is timed. As with the process described above with reference to FIGS. 15*a*-15*b* and 15*c*-15*d*, the virtual pivots can range in depth from 1 µm to 1000 µm, but typically are between 10 µm and 100 µm, or about 10% to 50% of the handle 103.

(g) The device 100 layer may be bonded to the insulator 102 on the handle 103. This can be accomplished via many techniques, including but not limited to fusion, Al—Ge, Au—Si, anodic, SLID (solid liquid interdiffusion), adhesive, Au—Au, Au—Sn, Cu—Cu, Cu—Sn, etc. The choice of bond may depend on the allowable thermal budget and available processes and integration requirements. The bond shown in FIGS. 16e and 16f is a fusion bond of oxide 102 to silicon 100.

(h) The edge grooves 300 may be patterned and etched into the device 100. This is typically accomplished with a timed DRIE. As with the process for FIGS. 15a-15b and 15c-15d, these grooves can have lateral dimensions between 100 nm and 1000 µm, but are typically between 2 µm and 10 µm. The grooves can have any depth from 0.1% to 100% of the device 100 thickness, but typically ranges from 25% to 75% of the device 100 thickness.

(i) The top portion of the virtual pivots 301a may be patterned and etched. This is typically accomplished with a timed DRIE. The lateral dimension of the top portion of 301a is typically smaller or larger laterally than the bottom portion of 301a to overcome alignment issues.

Figure 16C:
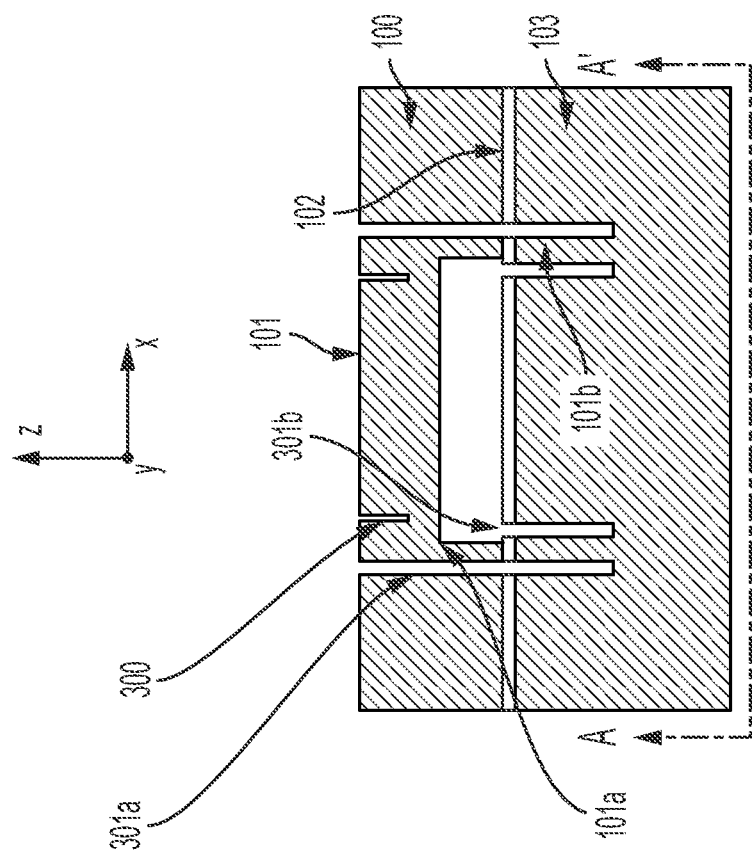
FIGS. 16C and 16D show an exemplary circular diaphragm cMUT with both edge groove and virtual pivot etches and with a conductive portion at the top of the handle substrate in lieu of a bottom electrode as in the cMUT of FIGS. 16A and 16B: (c) in layout form, and (d) in cross-section, respectively.
Figure 16D:
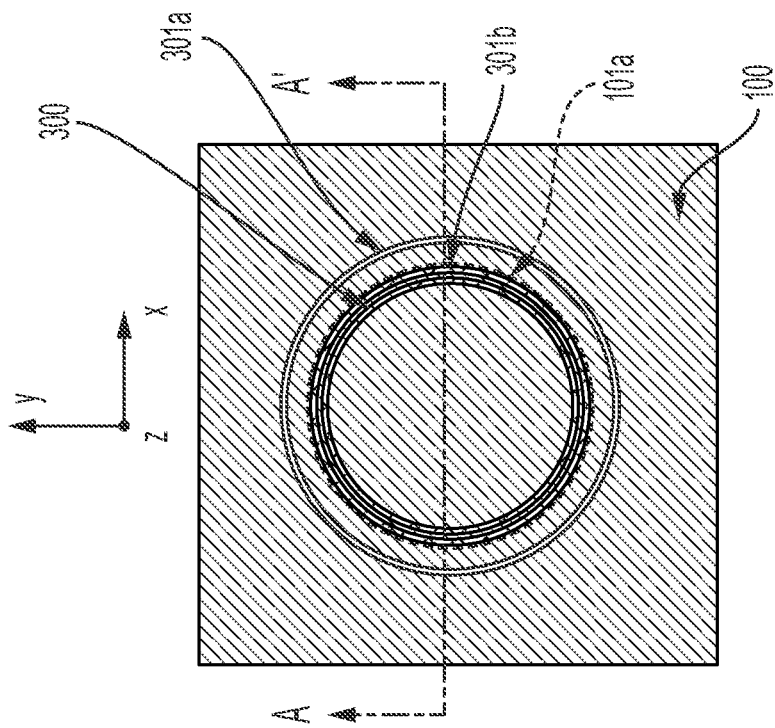
Figure 16H:
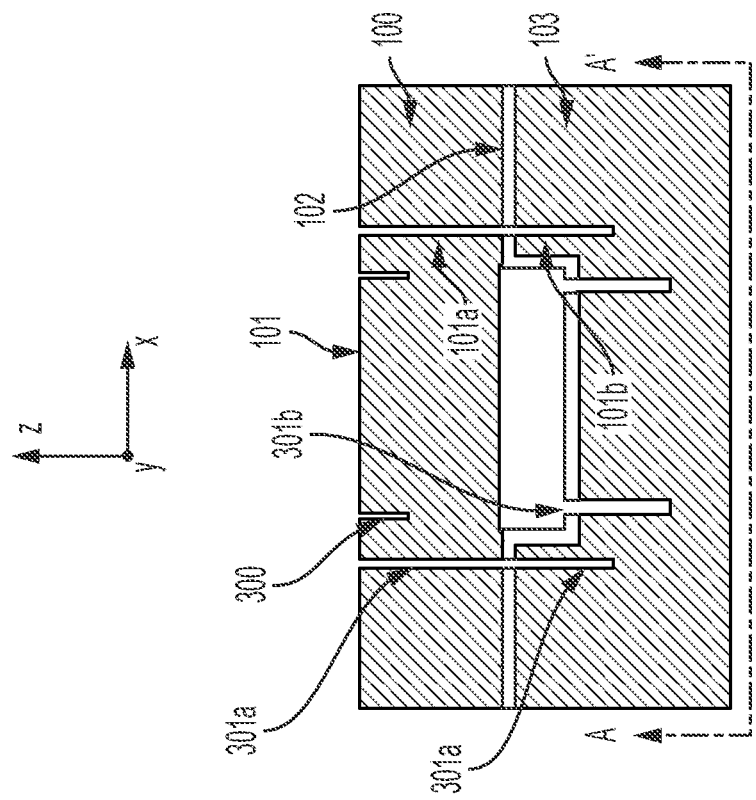
FIGS. 16G and 16H show an exemplary circular diaphragm cMUT with both edge groove and virtual pivot etches, and with the gap defining the diaphragm is formed in the handle: (g) in layout form, and (h) in cross-section, respectively.
Figure 16G:
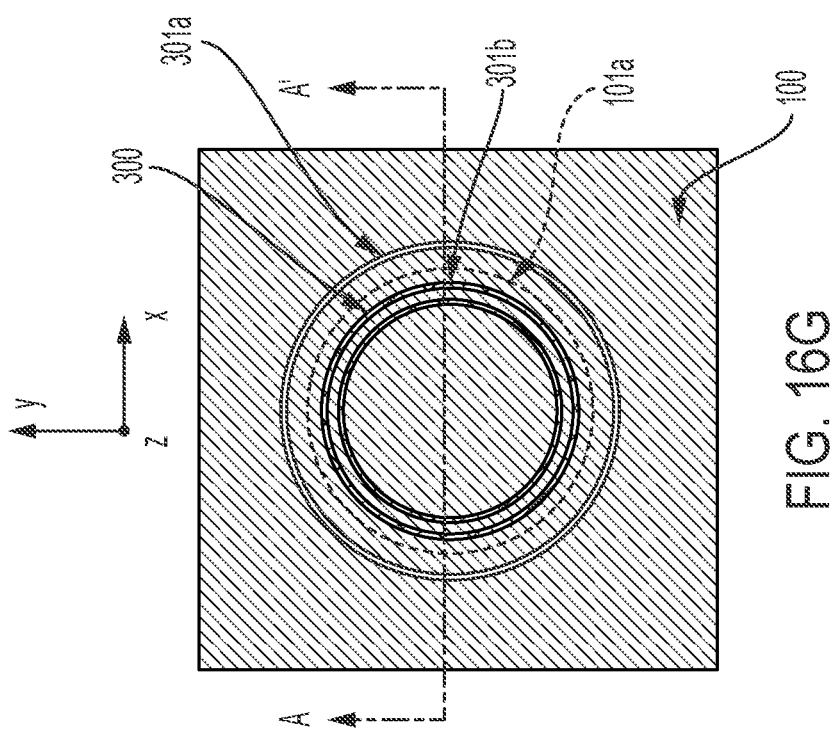
Figure 17B:
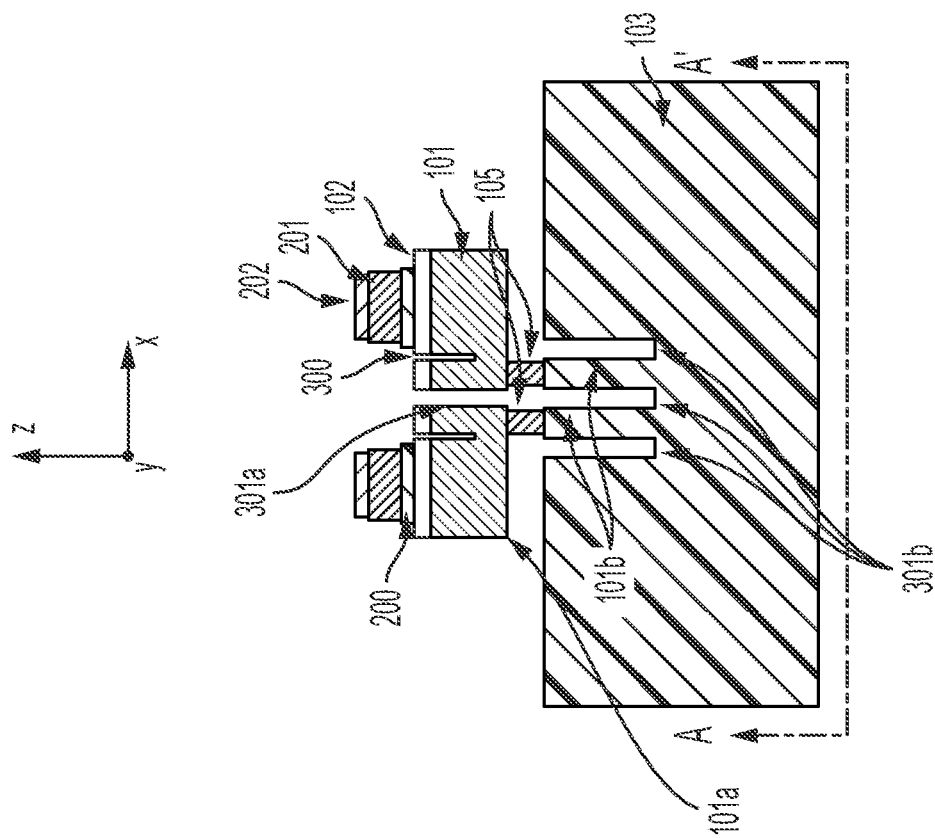
FIGS. 17A and 17B show an exemplary pMUT with free edges and a clamped center, and the piezoelectric stack opposite the anchor: (a) in layout form, and (b) in cross-section (the virtual pivot etch 301*b* is not shown in layout form for clarity purposes), respectively.
Figure 17A:
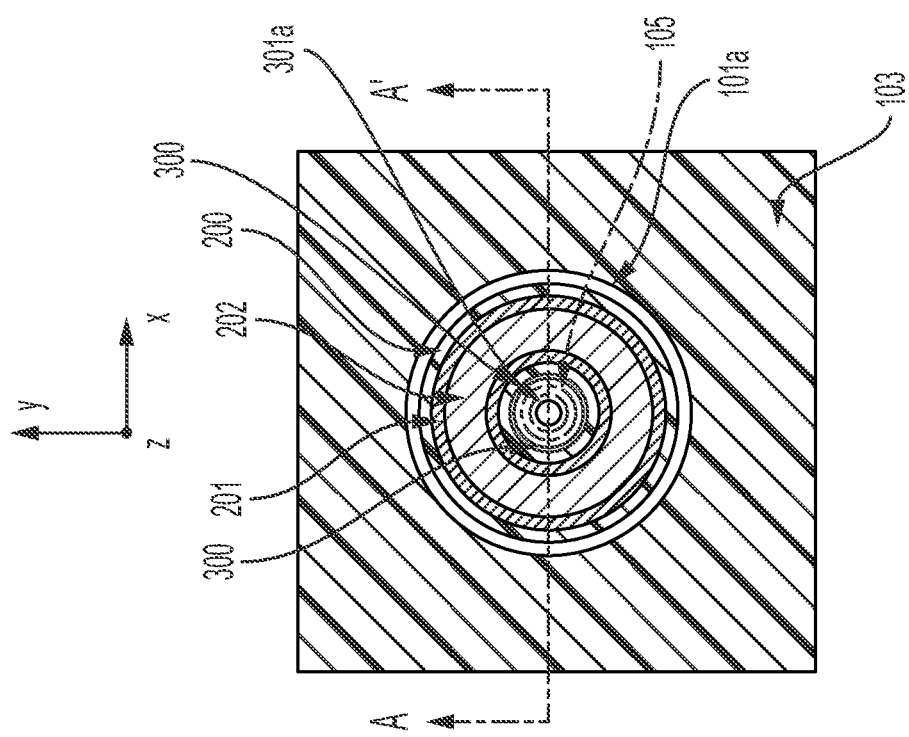
Figure 18B:
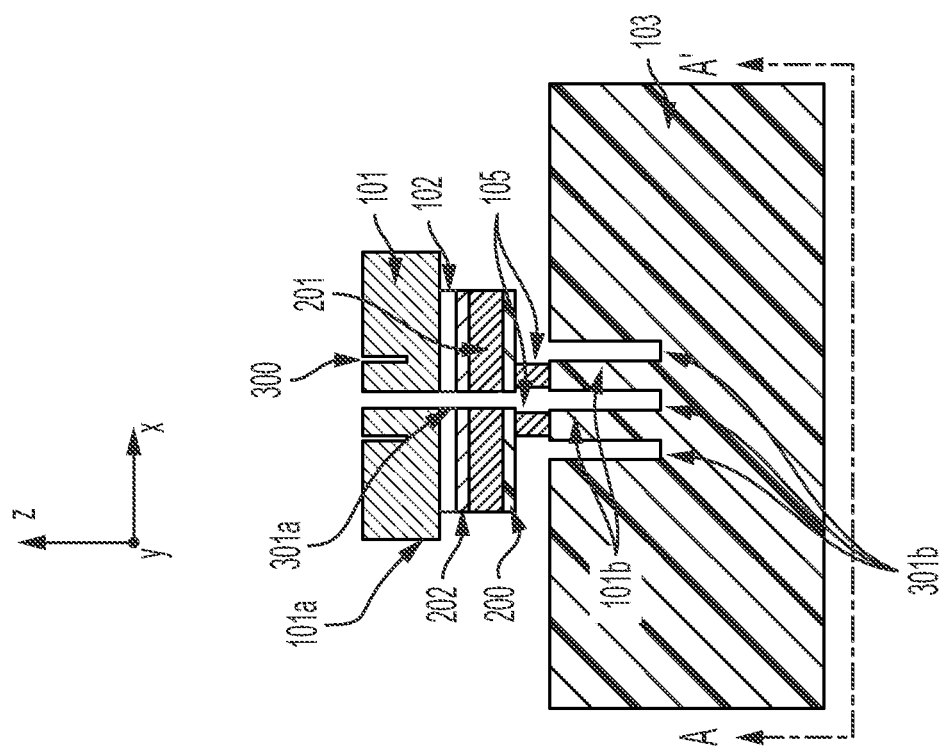
FIGS. 18A and 18B show an exemplary pMUT with free edges and a clamped center, and the piezoelectric stack on the same side as the anchor: (a) in layout form, and (b) in cross-section (the virtual pivot etch 301*b* is not shown in layout form for clarity purposes), respectively.
Figure 18A:
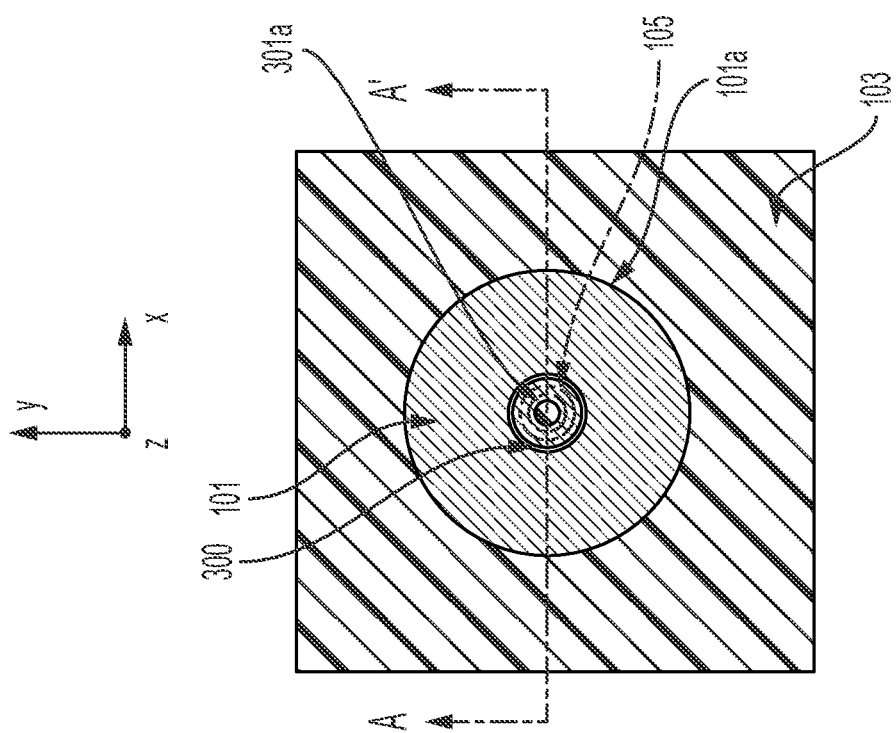
Figure 19B:
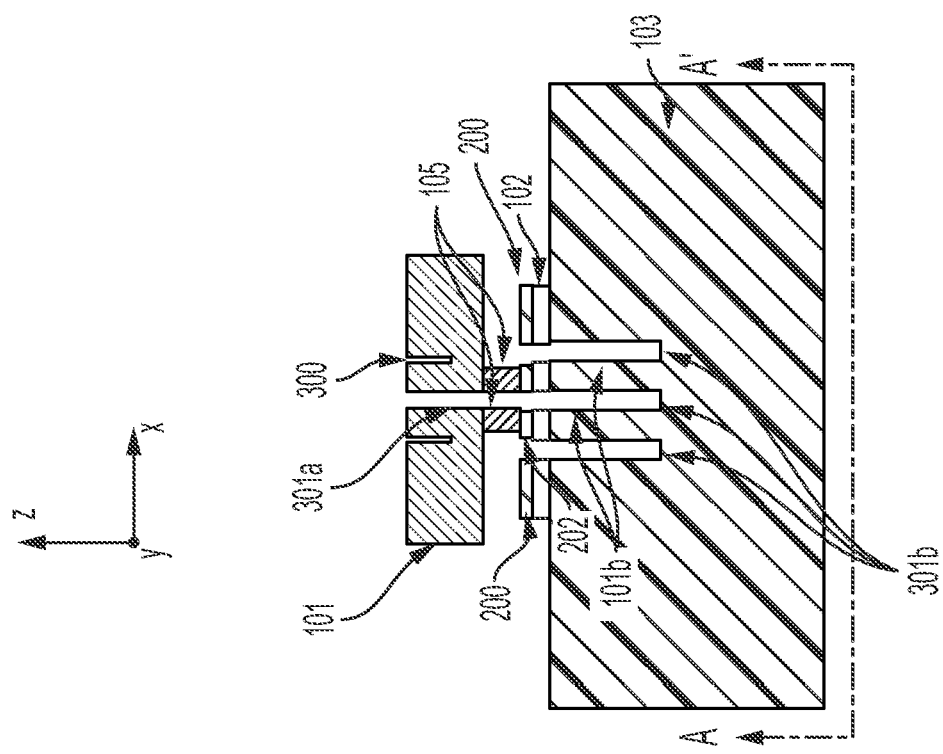
FIGS. 19A and 19B show an exemplary cMUT with free edges and a clamped center, and the opposing electrode situated between the substrate and diaphragm (which is assumed to be conductive in this example embodiment): (a) in layout form, and (b) in cross-section (the virtual pivot etch 301*b* is not shown in layout form for clarity purposes), respectively.
Figure 19A:
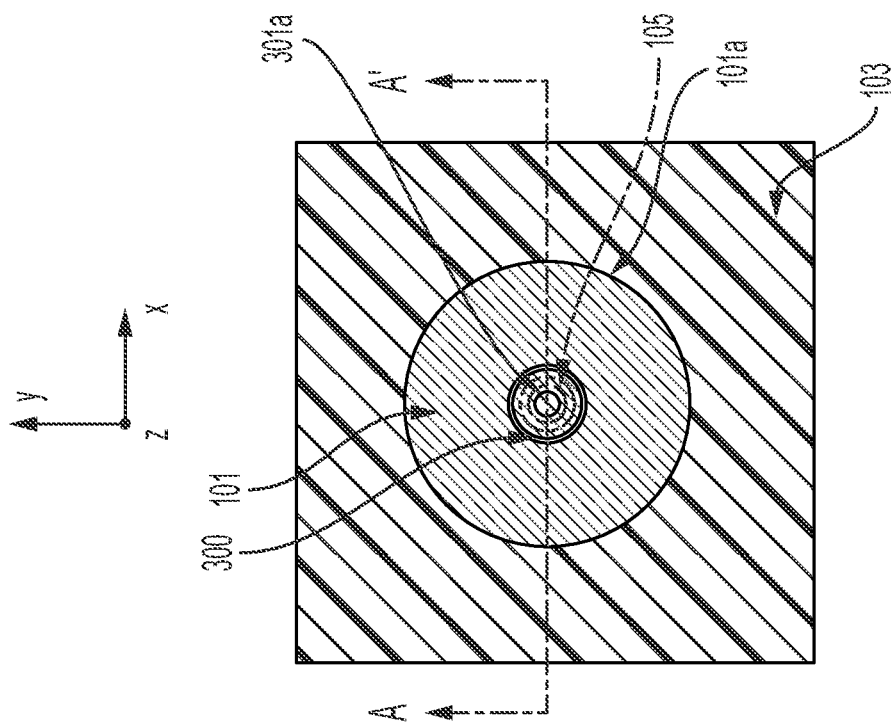

This method may be varied in many ways. In some embodiments, the steps (d) and (e) may be skipped to manufacture the cMUT shown in FIGS. 16g and 16h. In some embodiments, the step (b) may be performed on the bottom of the device instead to manufacture the cMUT shown in FIGS. 16a and 16b. In some embodiments, the steps (d) and (e) may be skipped and the step (b) may be performed on the bottom of the device instead to manufacture the cMUT shown in FIGS. 16c and 16d.

Nominal Free Edge Design and Method of Manufacture

Figure 20A:
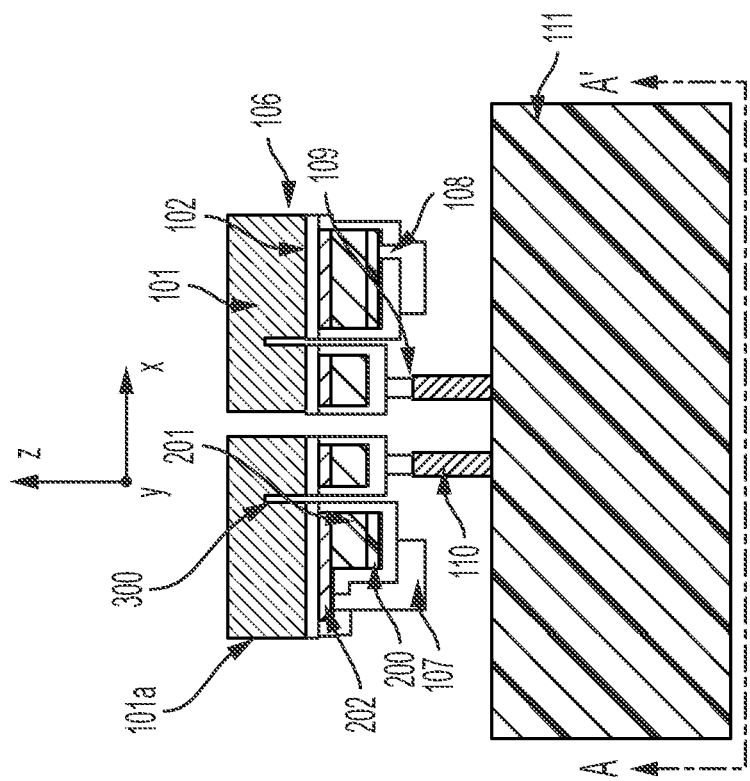
FIGS. 20A and 20B show an exemplary pMUT with free edges and a clamped center with two independent electrodes side-by-side and a redistribution layer to make contact to the top and bottom electrodes of the piezoelectric stack: (a) in layout form, and (b) in cross-section.
Figure 20B:
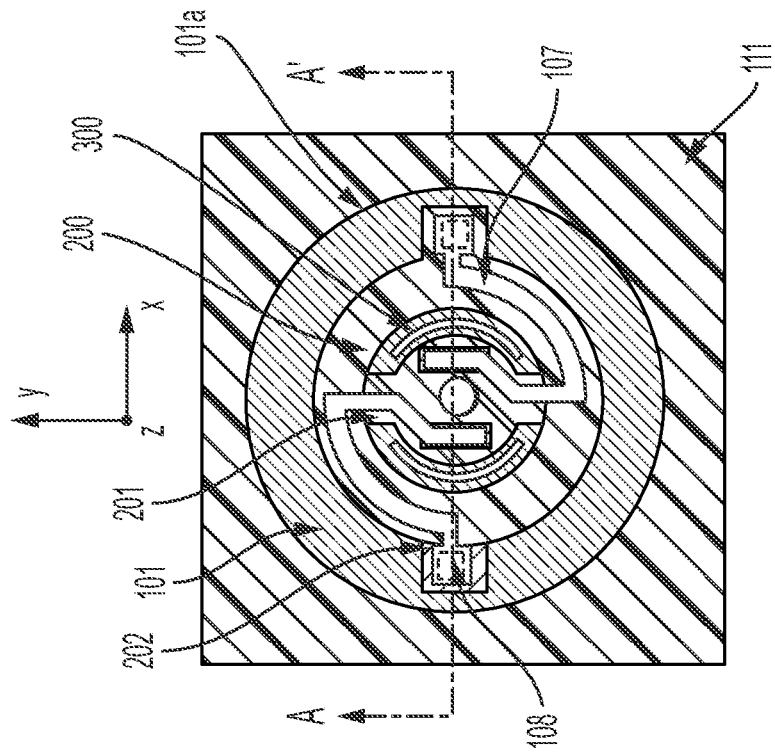

The nominal free edge design for pMUTs will typically require two independent contacts to the substrate. This is because a pMUT typically requires a voltage difference across its piezoelectric material, thus requiring at least two voltages. There are many ways to apply at least two voltages. FIGS. 20a and 20b show one exemplary pMUT free edge design and its process or method for manufacture is described as follows.

(a) The method may start with an SOI wafer. Typically, this is a device layer of single crystal silicon on top of a BOX (oxide) on top of a handle layer. This device layer of this wafer is shown upside down in FIGS. 20a and 20b.

(b) The insulating layer 102 may then be deposited. Typically, this deposition is some form of $SiO_2$, about 0.1 µm to 3 µm thick. It is commonly deposited via thermal oxidation, PECVD deposition, or other technique.

(c) A first metal layer or M1 (metal 1) 200 may be deposited. Typically, this deposition is a combination of films that adhere to the substrate, prevent diffusion of the piezoelectric, aid the piezoelectric in structured deposition/growth, and which is conductive. SRO ($SrRuO_3$) may be used for structured film growth on top of Pt for a diffusion barrier and conduction, on top of Ti as an adhesive layer (for Pt to $SiO_2$). Usually, these layers are thin, less than 200 nm, with some films 10 to 40 nm. Stress, manufacturing, and cost issues will usually limit this stack to less than 1 µm. The conductor (Pt) is typically thicker than the structuring layer (SRO) and adhesion layer (Ti). Other common structuring layers, rather than SRO, include $(La_{0.5}Sr_{0.5})CoO_3$, $(La_{0.5}Sr_{0.5})MnO_3$, $LaNiO_3$, $RuO_2$, $IrO_2$, $BaPbO_3$, to name a few. Pt can be replaced with other conductive materials such as Cu, Cr, Ni, Ag, Al, Mo, W, and NiCr. These other materials usually have disadvantages such as poor diffusion barrier, brittleness, or adverse adhesion, and Pt is the most common conductor used. The adhesion layer, Ti, can be replaced with any common adhesion layers such as TiW, TiN, Cr, Ni, Cr, etc.

(d) Piezoelectric material 201 may then be deposited. Common examples for the piezoelectric material include: PZT, KNN, PZT-N, PMN-Pt, AlN, Sc—AlN, ZnO, PVDF, and $LiNiO_3$. The thicknesses of the piezoelectric material may vary between 100 nm and 5 µm (possibly more).

(e) A second metal layer or M2 (metal 2) 202 may be deposited. M2 may be similar to M1 200 and can serve similar purposes. For M2, the same stack as M1 may be used, but in reverse: Ti for adhesion on top of Pt to prevent diffusion on top of SRO for structure.

(f) M2 202 may be patterned and etched, stopping on the piezoelectric. Etches can be made in many ways herein, for example, via RIE (reactive ion etching), ion mill, wet chemical etching, isotropic gas etching, etc. After patterning and etching, the photoresistor used to pattern M2 may be stripped, be wet and/or dry. In many embodiments for manufacturing cMUTs and pMUTs described herein, any number of ways of etching may be used, and the photoresist is typically stripped after most pattern and etch steps.

(g) The piezoelectric layer may then be similarly patterned and etched, stopping at the first metal layer or M1 200. Typically, wet, RIE, and/or ion mill etches are used.

(h) The first metal layer or M1 100 may then be similarly patterned and etched, stopping on the dielectric 102.

(i) If desired, an $H_2$ barrier may be added. $H_2$ diffusion into the piezoelectric layer can limit its lifetime. To prevent this, an $H_2$ barrier can be used. 40 nm of ALD (atomic layer deposition) aluminum oxide ($Al_2O_3$) may be used to accomplish this. Other suitable materials may include SiC, diamond-like carbon, etc.

(j) The dielectric layer 106 may deposit. This layer is typically an oxide and/or nitride layer (commonly PECVD), usually between 100 nm and 2 µm thick.

(k) Vias (or holes) 108 may be patterned and etched in the dielectric layer 106. This is typically done via RIE etch or some form of wet etch. The etch may stop on M1 or M2.

(l) A redistribution conductor 107 may be deposited, patterned, and etched. Typical conductors are metals (Al, Cu, Au, Ti, Cr, etc.) and/or semiconductors such as poly-Si, poly-Ge, or poly-SiGe. This layer is typically relatively thick to overcome topography and lower resistance, between 100 nm and 5 µm, though commonly between 0.5 µm and 2 µm. In an example, 1 µm of Au on top of 100 nm Ti on top of 1.6 µm Al is used. The Au is for the integration bond in step s, described further below.

(m) The grooves 300 may then be pattenered. The dielectric layer 102 may be etched via RIE or wet etching. The substrate 100 may be etched, and as the substrate 100 is typically silicon, the etch is typically DRIE (deep reactive ion etching). These grooves 300 can have lateral dimensions between 100 nm and 1000 µm but are typically between 2 µm and 10 µm. The grooves 300 can have any depth from 0.1% to 99.9% of the device 100 thickness, but typically ranges from 25% to 75% of the device 100 thickness.

(n) The device layer 101 may be patterned and etched. The dielectric layer 106 may be etched via RIE or wet etching. The substrate 100 may be etched, which is typically silicon, thus the etch is typically a DRIE (deep reactive ion etch). This etch may go through the entire device layer 100 until it stops on the BOX. These etches can have lateral dimensions between 100 nm and several cm, but are typically between 5 µm and 1000 µm.

(o) Optionally, a passivation layer may be deposited, patterned, and etched to prevent physical scratches, accidental shorting, and/or moisture ingress. This passivation is typically oxide and/or nitride, and commonly ranges from 300 nm to 2 μm thick.

(p) If desired, the backside of the wafer or handle can be thinned via grinding and optionally polished at this point. In many embodiments, the handle layer is thinned from 500 μm to 300 μm thick. Common thicknesses typically vary between 50 μm and 1000 μm.

(q) The MEMS wafer (101-102, 106-9, 200-202, 300, 101a, and a handle layer) is now diced in preparation for bond.

(r) The conductive bond material 110 may be deposited, patterned, and etched on the base substrate 111. The base substrate 111 can be a planarized ASIC wafer, for example. The conductive bond material may be 1 μm Au to enable the bond in step s.

(s) The MEMS die (101-102, 106-9, 200-202, 300, 101a, and a handle layer) may be aligned to the base substrate 111 and bonded, forming conductive bond 109 between redistribution conductor 107 and conductive bond material 110. Optionally, only good MEMS dice are chosen. The MEMS die may only be bonded to verified good ASIC dice to preserve yield. Bad ASIC dice are bonded with dummy MEMS dice for etch loading (in step t). The bond can be any conductive bond, including Au—Au thermocompression, SLID, Al—Ge, Au—Sn, Cu—Cu, etc. Au—Au thermocompression may be used, for example.

(t) The base substrate 111 can be populated with MEMS dice. The backside of the MEMS dice can be etched in a DRIE tool to remove the Handle silicon (not shown), stopping on BOX.

(u) The backside of the MEMS dice may be etched in an oxide RIE to remove the BOX, stopping on the device layer 101. Once complete, the layout and cross-section of FIGS. 20a and 20b can be considered achieved.

Of note for the pMUT of FIGS. 20a and 20b:

(a) The conductive bond 109 can allow electrical signals from the base substrate 111 to be passed to the MEMS die through conductive bond material 110 to redistribution conductor 107.

(b) There may be at least two independent signals, one connected to M1 layer 202 through via 108, and the other connected to M2 layer 200 through a similar Via 108. This can allow the designer to apply a known voltage difference across the piezoelectric layer 201, enabling actuation of the pMUT.

(c) The edge groove 300 can provides an enhanced $k_{eff}^2$.

(d) It is optionally possible to form a virtual pivot to further increase $k_{eff}^2$. If the conductive bond material 110 has a height much larger than its lateral dimensions, the bond can form a cantilevered shell.

(e) The above process can create pMUTs with free edges, grooves, and cantilever shells, and may combine only known good dice to enhance yield.

(f) One skilled in the art may use this method of manufacture, coupled with the design concepts of grooves, free edges, and virtual pivots to create a wide range of novel pMUTs Although various methods of manufacturing pMUTs and cMUTs are described above in accordance with many embodiments, a person of ordinary skill in the art will recognize many variations based on the teaching described herein. The steps may be completed in a different order. Steps may be added or deleted. Some of the steps may comprise sub-steps. Manufacturing techniques known in the art may be applied for one or more of the steps. Many of the steps may be repeated as often as beneficial.

REFERENCES

[1] R. D. Blevins. Formulas for natural frequency and mode shape. Kreiger, 1979.
[2] K. M. Smyth. Piezoelectric Micro-machined Ultrasonic Transducers for Medical Imaging. Massachusetts Institute of Technology, 2017.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention.

What is claimed is:

1. A micromachined ultrasonic transducer (MUT) comprising (i) a piezoelectric stack comprising a top electrode, a bottom electrode, and a piezoelectric layer disposed therebetween and (ii) a diaphragm disposed below the piezoelectric stack and comprising a groove that is disposed within the diaphragm and at least partially surrounds the piezoelectric stack.

2. The MUT of claim 1, wherein the MUT is a pMUT.

3. The MUT of claim 2, wherein the groove is within 20 diaphragm thicknesses of a diaphragm boundary, and wherein the groove has a width no larger than 10 diaphragm thicknesses, and wherein the groove has a depth of between 1% to 100% of the diaphragm thickness.

4. The MUT of claim 3, wherein the groove has a constant width.

5. The MUT of claim 3, wherein the groove has a variable width.

6. The MUT of claim 3, wherein the groove is disrupted at one or more locations to allow for electrical routing.

7. The MUT of claim 6, wherein the MUT is multimodal.

8. A MUT array configured for ultrasound imaging, the array comprising a plurality of the MUTs of claim 7.

9. The MUT of claim 1, wherein the MUT is a cMUT.

10. The MUT of claim 9, wherein the groove is within 20 diaphragm thicknesses of a diaphragm boundary, and wherein the groove has a width no larger than 10 diaphragm thicknesses, and wherein the groove has a depth of between 1% to 100% of the diaphragm thickness.

11. The MUT of claim 10, wherein the groove has a constant width.

12. The MUT of claim 10, wherein the groove has a variable width.

13. The MUT of claim 10, wherein the groove is disrupted at one or more locations to allow for electrical routing.

14. The MUT of claim 13, wherein the MUT is multimodal.

15. A MUT array configured for ultrasound imaging, the array comprising a plurality of the MUTs of claim 14.

16. The MUT of claim 1, wherein the groove comprises one or more grooves.

17. The MUT of claim 16, wherein all of the one or more grooves are disposed inside of a diaphragm boundary.

18. The MUT of claim 16, wherein all of the one or more grooves are disposed outside of a diaphragm boundary.

19. The MUT of claim 16, wherein the one or more grooves comprises at least a first groove disposed inside a diaphragm boundary and at least a second groove disposed outside of the diaphragm boundary.

20. A micromachined ultrasonic transducer (MUT) comprising:
a substrate that forms a diaphragm, the diaphragm having a vertical thickness;
one or more electrodes located on or near the diaphragm; and
a groove cut into the diaphragm and at least partially surrounding the one or more electrodes, the groove having a depth that does not cut entirely through the vertical thickness of the diaphragm.

21. The MUT of claim 20, wherein the MUT is a pMUT comprising a piezoelectric film.

22. The MUT of claim 21, wherein the one or more electrodes are electrically coupled to the piezoelectric film.

23. The MUT of claim 20, wherein the MUT is a cMUT.

24. The MUT of claim 23, wherein the one or more electrodes are electrically coupled to the diaphragm between a gap.

25. The MUT of claim 21, further comprising one or more anchors clamping the diaphragm.

26. The MUT of claim 25, wherein the piezoelectric film is situated opposite the one or more anchors.

27. The MUT of claim 25, wherein the piezoelectric film is situated on the same side as the one or more anchors.

28. The MUT of claim 25, wherein the piezoelectric film is between the one or more anchors and the diaphragm.

29. The MUT of claim 20, further comprising a plurality of anchors, wherein a subset of the plurality of anchors are attached to one or more vertical cantilever shells.

30. The MUT of claim 20, wherein the groove completely surrounds the one or more electrodes without a break in the groove.

31. The MUT of claim 20, wherein the groove is broken up to discontinuously surround the one or more electrodes.

32. The MUT of claim 1, further comprising a substrate and an insulating layer.

33. The MUT of claim 32, wherein the diaphragm is supported by the substrate.

34. The MUT of claim 32, wherein the diaphragm is formed as a portion of the substrate.

35. The MUT of claim 32, wherein the substrate comprises a cavity, the diaphragm being supported by the substrate above the cavity.

36. The MUT of claim 1, further comprising an insulating layer disposed between the diaphragm and the piezoelectric stack.

37. The MUT of claim 36, wherein the insulating layer comprises a dielectric layer.

38. The MUT of claim 1, wherein the piezoelectric stack is disposed entirely within by a cylinder defined as a vertical projection of the groove upwardly from the diaphragm.

39. The MUT of claim 1, wherein the piezoelectric stack defines a perimeter that is circumscribed by the groove when seen in a top view.

40. The MUT of claim 39, wherein at least one of the top electrode, the bottom electrode, or the piezoelectric layer comprises a circular profile when seen in top view.

41. The MUT of claim 40, wherein the top electrode, the bottom electrode, and the piezoelectric layer have different circular profiles compared to each other when seen in top view.

42. The MUT of claim 1, wherein the top electrode, the bottom electrode, and the piezoelectric layer each defines a respective perimeter, the perimeter of the top electrode being circumscribed by the perimeter of the piezoelectric layer, the perimeter of the piezoelectric layer being circumscribed by the perimeter of the bottom electrode, the perimeter of the bottom electrode being circumscribed by the groove.

43. The MUT of claim 1, wherein the groove has a depth that does not cut entirely through a vertical thickness of the diaphragm.

44. The MUT of claim 1, wherein the groove has a depth of about 0.01% to about 100% of a vertical thickness of the diaphragm.

45. The MUT of claim 1, further comprising a trench extending into a substrate, the groove being disposed between the trench and the piezoelectric stack when seen in a side view.

46. The MUT of claim 1, wherein the groove completely surrounds the piezoelectric stack without a break in the groove.

47. The MUT of claim 1, wherein the groove is broken up to discontinuously surround the piezoelectric stack.

48. A micromachined ultrasonic transducer (MUT) comprising a piezoelectric stack and a substrate, the piezoelectric stack comprising a top electrode, a bottom electrode, and a piezoelectric layer disposed between the top and bottom electrodes, the substrate comprising an upper surface that supports the piezoelectric stack and a channel that extends into the substrate and at least partially surrounds the piezoelectric stack.

49. The MUT of claim 48, wherein the substrate comprises a cavity cut into the substrate that forms a diaphragm located above the cavity.

50. The MUT of claim 49, further comprising a buried insulator layer disposed immediately below the diaphragm.

51. The MUT of claim 49, wherein the channel comprises a groove having a depth of about 0.01% to about 100% of a vertical thickness of the diaphragm.

52. The MUT of claim 49, wherein a diaphragm boundary is defined by an edge of the cavity and a diaphragm thickness is defined by a height of the cavity.

53. The MUT of claim 52, wherein the channel comprises a groove located within the diaphragm boundary that has a depth that is less than the diaphragm thickness.

54. The MUT of claim 52, wherein the channel comprises a groove located outside of the diaphragm boundary that has a depth that is less than the diaphragm thickness.

55. The MUT of claim 52, wherein the channel comprises a trench located outside of the diaphragm boundary that has a depth that is greater than or equal to the diaphragm thickness.

56. The MUT of claim 53, wherein the channel further comprises a trench extending into the substrate outside the diaphragm boundary, the groove being disposed between the trench and the piezoelectric stack when seen in a side view.

57. The MUT of claim 54, wherein the channel further comprises a trench extending into the substrate outside the diaphragm boundary, the groove being disposed between the trench and the piezoelectric stack when seen in a side view.

58. The MUT of claim 54, wherein the channel further comprises a trench extending into the substrate outside the diaphragm boundary, the trench being disposed between the groove and the piezoelectric stack when seen in a side view.

59. The MUT of claim 53, wherein the channel further comprises one or more grooves.

60. The MUT of claim 48, wherein the channel completely surrounds the piezoelectric stack without a break in the channel.

61. The MUT of claim 48, wherein the channel is broken up to discontinuously surround the piezoelectric stack.

* * * * *